US011424251B2

(12) United States Patent
Kang et al.

(10) Patent No.: US 11,424,251 B2
(45) Date of Patent: Aug. 23, 2022

(54) SEMICONDUCTOR DEVICE

(71) Applicant: SAMSUNG ELECTRONICS CO., LTD., Suwon-si (KR)

(72) Inventors: Byounggon Kang, Seoul (KR); Taejun Yoo, Suwon-si (KR); Seunghyun Yang, Bucheon-si (KR); Dalhee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/219,175

(22) Filed: Mar. 31, 2021

(65) Prior Publication Data

US 2022/0108989 A1 Apr. 7, 2022

(30) Foreign Application Priority Data

Oct. 6, 2020 (KR) ........................ 10-2020-0128726

(51) Int. Cl.
*H01L 27/11* (2006.01)
*G11C 11/41* (2006.01)
*G11C 11/412* (2006.01)
*G11C 11/417* (2006.01)
*H01L 23/528* (2006.01)

(52) U.S. Cl.
CPC ........ *H01L 27/1104* (2013.01); *G11C 11/412* (2013.01); *G11C 11/417* (2013.01); *H01L 23/5286* (2013.01); *H01L 27/1108* (2013.01)

(58) Field of Classification Search
None
See application file for complete search history.

(56) References Cited

U.S. PATENT DOCUMENTS 5,982,211 A 11/1999 Ko
6,384,674 B2 * 5/2002 Tanizaki ............... G11C 5/063
327/544

(Continued)

FOREIGN PATENT DOCUMENTS

JP 2014049579 A 3/2014
KR 1020210029866 A 3/2021

OTHER PUBLICATIONS

Kim, J., et al., "Minimizing Leakage Power in Sequential Circuits by Using Mixed V Flip-Flops", IEEE, 2007, pp. 797-802.

*Primary Examiner* — Tan T. Nguyen
(74) *Attorney, Agent, or Firm* — Sughrue Mion, PLLC

(57) ABSTRACT

A semiconductor device is provided. The semiconductor device includes power supply lines extending in a first direction; first transistors, each of which is formed in a first region and has a first threshold voltage; and second transistors, each of which is formed in a second region and has a second threshold voltage higher than the first threshold voltage. One of the plurality of power supply lines is interposed between the first region and the second region, the first transistors implement a first portion of a multiplexer, a clock buffer and a first latch that are disposed on a data path, the second transistors implement a second portion of the multiplexer circuit and a second latch that are disposed on a feedback path, and the first portion of the multiplexer circuit and the second portion of the multiplexer circuit are disposed in a common location along the first direction.

20 Claims, 31 Drawing Sheets

(56) References Cited

U.S. PATENT DOCUMENTS

| | | | |
|---|---|---|---|
| 6,426,908 B1 * | 7/2002 | Hidaka | G11C 5/14 |
| | | | 365/222 |
| 6,445,041 B1 * | 9/2002 | Ishida | H01L 27/11 |
| | | | 257/E27.099 |
| 6,462,978 B2 * | 10/2002 | Shibata | H01L 27/0207 |
| | | | 257/338 |
| 7,248,090 B2 | 7/2007 | Ramprasad | |
| 7,340,712 B2 | 3/2008 | Correale, Jr. | |
| 7,391,249 B2 | 6/2008 | Lee et al. | |
| 8,610,176 B2 | 12/2013 | Patel et al. | |
| 8,957,716 B2 | 2/2015 | Penzes | |
| 2005/0104133 A1 * | 5/2005 | Kanno | G01R 31/318572 |
| | | | 257/E27.062 |
| 2012/0274404 A1 | 11/2012 | Erdogan et al. | |
| 2021/0075406 A1 | 3/2021 | Kim et al. | |

\* cited by examiner

SEMICONDUCTOR DEVICE

CROSS-REFERENCE TO THE RELATED APPLICATION

This application claims priority from Korean Patent Application No. 10-2020-0128726 filed on Oct. 6, 2020 in the Korean Intellectual Property Office, the disclosure of which is incorporated herein by reference in its entirety.

BACKGROUND

Methods, apparatuses and systems consistent with example embodiments relate to a semiconductor device.

Semiconductor devices include semiconductor storage devices storing logical data, semiconductor logic devices processing logical data, and hybrid semiconductor devices including a memory elements and logic elements. Recently, as semiconductor processes become more refined, there has been increasing demand for operating characteristics of a semiconductor memory device such as a flip-flop in a semiconductor chip design. However, an operating characteristic for reducing power consumption and an operating characteristic for increasing operating speeds conflict with each other. Moreover, even when the two operating characteristics are desired to be adjusted with balance, it may be difficult to significantly use a semiconductor device.

SUMMARY

Example embodiments provide a semiconductor device which may reduce power consumption while maintaining operating speed at a similar level using a layout of a semiconductor device including transistors having different threshold voltages, and may have improved performance.

According to an aspect of an example embodiment, a semiconductor device includes a plurality of power supply lines extending in a first direction; a plurality of first transistors, each of which is formed in a first region and has a first threshold voltage; and a plurality of second transistors, each of which is formed in a second region and has a second threshold voltage that is higher than the first threshold voltage. One of the plurality of power supply lines is interposed between the first region and the second region, the plurality of first transistors implement a first portion of a multiplexer circuit, a clock buffer and a first latch circuit that are disposed on a data path, the plurality of second transistors implement a second portion of the multiplexer circuit and a second latch circuit that are disposed on a feedback path, and the first portion of the multiplexer circuit and the second portion of the multiplexer circuit are disposed in a common location along the first direction.

According to an aspect of an example embodiment, a semiconductor device includes a scan circuit including a first circuit and a second circuit, wherein the first circuit is configured to receive a data signal and the second circuit is configured to receive a scan input signal; and a latch circuit including a third circuit and a fourth circuit, wherein the third circuit is disposed on a data path and the fourth circuit is disposed on a feedback path. A plurality of first transistors having a first threshold voltage implement the first circuit and the third circuit, a plurality of second transistors having a second threshold voltage implement the second circuit and the fourth circuit, the second threshold voltage being higher than the first threshold voltage, a power supply line extending in a first direction is interposed between the plurality of first transistors and the plurality of second transistors, a first dummy region is disposed on one side of the first circuit in the first direction, and a second dummy region is disposed on another side of the first circuit in the first direction, and a first common node of the first circuit and the second circuit is connected to the second circuit by a first active contact intersecting the power supply line in a second direction, perpendicular to the first direction.

According to an aspect of an example embodiment, a semiconductor device includes a first power supply line, a second power supply line, and a third power supply line, extending along a first direction; a plurality of first transistors having a first characteristic and being disposed in a first region between the first power supply line and the second power supply line; and a plurality of second transistors having a second characteristic, different from the first characteristic, and being disposed in a second region between the second power supply line and the third power supply line. A distance between the first power supply line and the second power supply line is greater than a distance between the second power supply line and the third power supply line, and the first characteristic and the second characteristic include any one or any combination of a transistor threshold voltage, a distance between gates, and a cell height.

BRIEF DESCRIPTION OF DRAWINGS

The above and other aspects, features, and advantages will become more apparent from the following description of example embodiments with reference to the accompanying drawings.

DETAILED DESCRIPTION

Hereinafter, example embodiments will be described with reference to the accompanying drawings.

Figure 1:
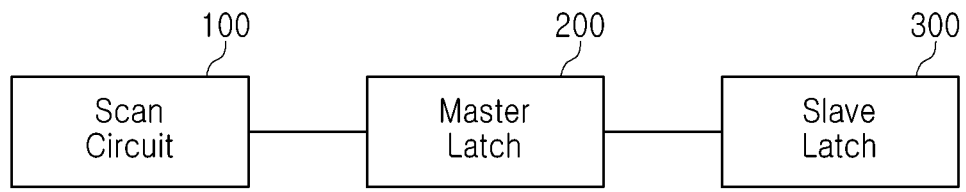
FIG. 1 is a block diagram of a semiconductor device according to an example embodiment.
Figure 2:
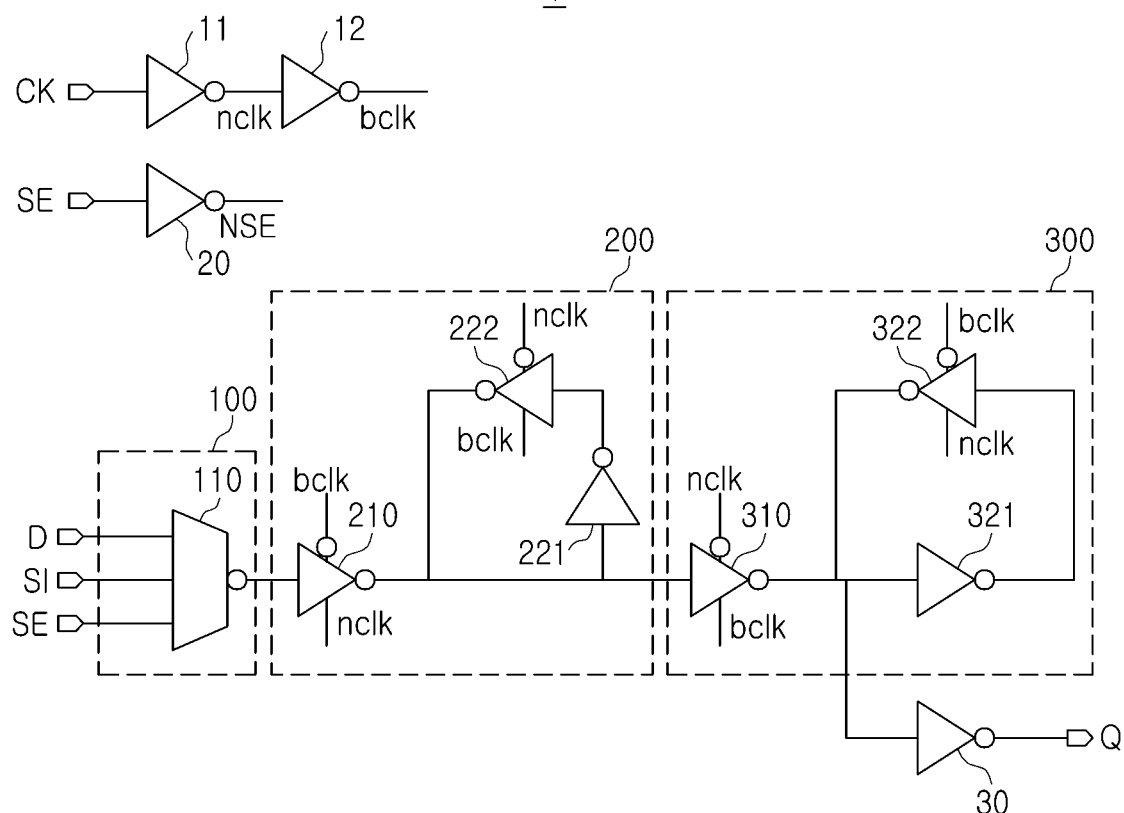
FIGS. 2 and 3 are circuit diagrams of a semiconductor device according to an example embodiment.

FIG. 1 is a block diagram of a semiconductor device according to an example embodiment, and FIG. 2 is a circuit diagram of a semiconductor device according to an example embodiment.

Referring to FIGS. 1 and 2, a semiconductor device 1 according to an example embodiment may include a scan circuit 100, a master latch circuit 200, and a slave latch circuit 300. As an example, the semiconductor device 1 may include a flip flop. For example, the semiconductor device 1 may include a master-slave flip-flop.

In the semiconductor device 1, the scan circuit 100 may receive a data signal D, a scan enable signal SE, and a scan input signal SI, and may output one of the data signal D and the scan input signal SI according to a control signal.

The data signal D may be a normal data signal input during a normal operation of a semiconductor chip, and the scan input signal SI may be a test signal for testing the semiconductor device 1 during a test operation of the semiconductor chip. The scan enable signal SE may be a signal commanding the semiconductor device 1 to output the scan input signal SI.

As an example, the scan circuit 100 may output the scan input signal SI when the scan enable signal SE has a logic high value. The scan circuit 100 may output the data signal D to a node when the scan enable signal SE has a logic low value.

The scan circuit 100 may include three inverters. As an example, an inverter outputting the data signal D and an inverter outputting the scan input signal SI may be different from each other. As an example, the scan circuit 100 included in the semiconductor device 1 may include a multiplexer circuit 110 or a plurality of transmission gates.

The semiconductor device 1 may include two latch circuits. As an example, the two latch circuits may include a master latch circuit 200 and a slave latch circuit 300, respectively. The master latch circuit 200 may store and output the data signal D output from the scan circuit 100. As an example, the master latch circuit 200 may output the input data signal D based on a first clock signal bclk and a second clock signal nclk, an inverted signal of the first clock signal bclk.

The slave latch circuit 300 may store the data signal D output from the master latch circuit 200 and may output the stored data signal D, based on the first clock signal bclk and the second clock signal nclk.

Each of the master latch circuit 200 and the slave latch circuit 300 may include one inverter and two three-state inverters. As an example, the master latch circuit 200 may include a first inverter 221, a first three-state inverter 210, and a second three-state inverter 222, and the slave latch circuit 300 may include a second inverter 321, a third three-state inverter 310, and a fourth three-state inverter 322.

In the master latch circuit 200 included in the semiconductor device 1, an input terminal of the first three-state inverter 210 may be connected to an output terminal of the scan circuit 100, and an output terminal of the three-state inverter 210 may be connected to an input terminal of the slave latch circuit 300. An input terminal of the first inverter 221 and an output terminal of the second three-state inverter 222 may be connected to the output terminal of the first three-state inverter 210. An output terminal of the first inverter 221 may be connected to an input terminal of the second three-state inverter 222.

The first three-state inverter 210 may invert and output the received data signal D, when the first clock signal bclk has a logic low value and the second clock signal nclk has a logic high value. When the first clock signal bclk has a logic high value and the second clock signal nclk has a logic low value, the second three-state inverter 222 may be cut off from the output terminal of the first three-state inverter 210.

The second three-state inverter 222 may perform another inversion operation based on an output signal of the first three-state inverter 210 as inverted by the first inverter 221. As an example, when the first clock signal bclk has a logic high value and the second clock signal nclk has a logic low value, the second three-state inverter 222 may perform another inversion operation based on an output of the first inverter 221, the inverted output of the first three-state inverter 210. When the first clock signal bclk has a logic low value and the second clock signal nclk has a logic high value, the first three-state inverter 210 may be cut off from the output terminal of the second three-state inverter 222.

The slave latch circuit 300 may include circuits having a connection relationship corresponding to the circuits included in the master latch circuit 200. As an example, the slave latch circuit 300 may include a third three-state inverter 310 corresponding to the first three-state inverter 210 of the master latch circuit 200, a second inverter 321 corresponding to the first inverter 221 of the master latch circuit 200, and a fourth three-state inverter 322 corresponding to the second three-state inverter 222 of the master latch circuit 200.

However, the third and fourth three-state inverters 310 and 322, included in the slave latch circuit 300, may operate opposite to the corresponding first and second three-state inverters 210 and 222 of the master latch circuit 200.

For example, the third three-state inverter 310 may be connected to the output terminal of the master latch circuit 200 in correspondence to the first three-state inverter 210, but may operate in the same manner as the second three-state inverter 222. In addition, the fourth three-state inverter 322 may be connected to the output terminal of the third three-state inverter 310 in correspondence to the second three-state inverter 222, but may operate in the same manner as the first three-state inverter 210.

The semiconductor device 1 may further include clock buffers 11 and 12, a scan enable inverter 20, and an output inverter 30.

The clock buffers 11 and 12 may include a third inverter 11 and a fourth inverter 12, and may output a first clock signal bclk and a second clock signal nclk according to a clock signal CK. As an example, the third inverter 11 may receive the clock signal CK and may invert and output the received clock signal CK to output the second clock signal nclk. The fourth inverter 12 may receive the second clock signal nclk and may perform another inversion operation based on the received second signal nclk to output the first clock signal bclk.

The first clock signal bclk may be a buffered clock signal CK, and the first clock signal bclk and the clock signal CK may be different from each other. However, this is only an example and the present disclosure is not limited thereto. According to example embodiments, the first clock signal bclk and the second clock signal nclk may be generated using only one inverter to configure a low power circuit. As an example, when the first clock signal bclk and the second clock signal nclk are generated using only one inverter, an unbuffered clock signal and an inverted clock signal may be provided to operate a circuit.

The semiconductor device 1 may further include a fifth inverter 20 and a sixth inverter 30. As an example, the fifth inverter 20 may be a scan enable inverter 20, and the sixth inverter 30 may be an output inverter 30. The scan enable inverter 20 may output a scan enable signal NSE formed by inverting the scan enable signal SE. The output inverter 30 may invert the data signal D output from the slave latch circuit 300, and may output the inverted signal as an output signal Q.

Each of the circuits, included in the semiconductor device 1, may include a plurality of transistors. In general, elements used in a master-slave flip-flop circuit may be transistors having the same threshold voltage.

A transistor having a low threshold voltage may be used to increase an operating speed of the semiconductor device 1. However, when a transistor having a low threshold voltage is used, leakage current may be increased. As semiconductor processes become more refined, it is necessary to significantly reduce leakage current. Therefore, it may be necessary to use a transistor which balances a decrease of the leakage current with an increase of the operating speed.

Figure 3:
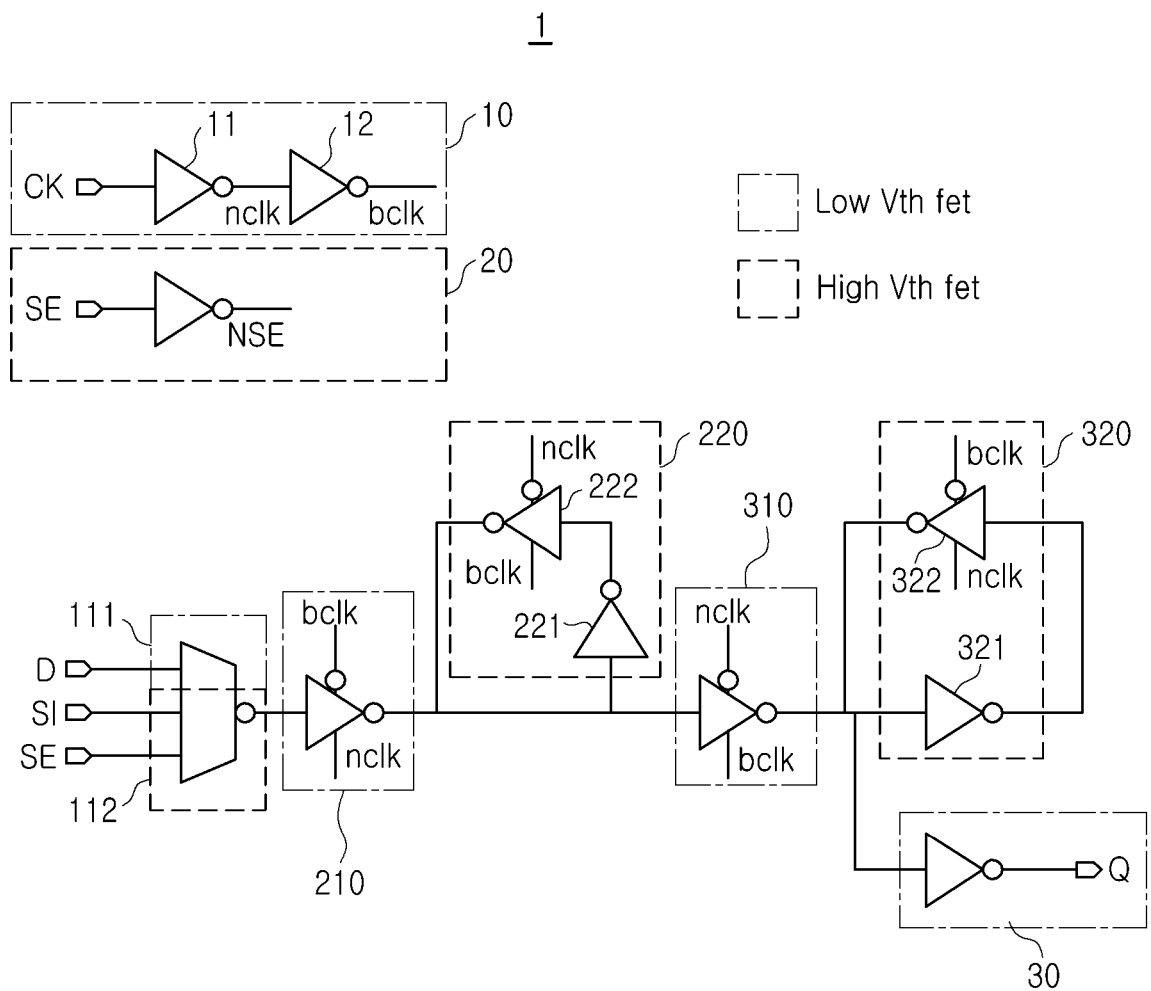

FIG. 3 is a circuit diagram of a semiconductor device according to an example embodiment.

Referring to FIG. 3, in the semiconductor device 1 according to an example embodiment, a path on which an input signal travels may be divided into a data path on which a data signal is received and transmitted, and a feedback path on which the received data signal is maintained.

As an example, in a multiplexer circuit, a first circuit 111 receiving a data signal D, a clock buffer circuit 10, a first master latch circuit 210 including a first three-state inverter 210, a first slave latch circuit 310 including a third three-state inverter 310, and an output inverter 30 may be disposed on the data path.

In the multiplexer circuit, a second circuit 112 receiving a scan input signal SI, a scan enable inverter 20, a second master latch circuit 220, and a second slave latch circuit 320 may be disposed on the feedback path. The second master latch circuit 220 may include a first inverter 221 and a second three-state inverter 222, and the second slave latch circuit 320 may include a second inverter 321 and a fourth three-state inverter 322.

In the semiconductor device 1, each of the circuits disposed on the data path may include a plurality of first transistors, and each of the circuits disposed on the feedback path may include a plurality of second transistors. As an example, the plurality of first transistors may have a first threshold voltage, and the plurality of second transistors may have a second threshold voltage.

An operating speed of the semiconductor device 1 may be determined, or limited, by a critical path on which, among all operations, a longest time-consuming operation is performed. As an example, the operating speed of the semiconductor device 1 may be determined by the circuits disposed on the data path. The operating speed of the semiconductor device 1 may be increased using transistor having a low threshold voltage.

However, as described above, when a transistor having a low threshold voltage is used, leakage current may be increased. Accordingly, transistors having different threshold voltages may be used according to paths to minimize an increase in the leakage current while increasing the operating speed. The first threshold voltage of the plurality of first transistors, disposed on the data path, may be lower than the second voltage of the plurality of second transistors disposed on the feedback path.

In the semiconductor device 1, the plurality of first transistors, disposed on the data path, and the plurality of second transistors, disposed on the feedback path, may have different characteristics to reduce power consumption of the semiconductor device 1 and to significantly improve performance. As an example, the plurality of first transistors may have a first characteristic, and the plurality of second transistors may have a second characteristic, different from the first characteristic. As described above, the first characteristic and the second characteristic may be threshold voltages of transistors.

However, this is only an example and the present disclosure is not limited. The first characteristic and the second characteristic may include any one or any combination of a distance between gates defining the transistor, a height of a cell including the transistor and the gates, the number of fin structures, and a length of a nanosheet. As an example, when the semiconductor device 1 includes FinFET elements in which active fins having a fin structure are included in active regions, the first characteristic and the second characteristic may include the number of fin structures. As an example, when the semiconductor device 1 includes MBCFET elements, each being a gate-all-around transistor in which a gate structure is disposed between active fins and channel layers and between a plurality of channel layers having a nanosheet shape, the first characteristic and the second characteristic may include a length of a nanosheet.

According to the semiconductor device 1, reduced power consumption and significantly improved performance may be achieved using the plurality of first transistors that have the first characteristic and the plurality of second transistors that have the second characteristic. As an example, the first characteristic of the plurality of first transistors, having a direct relation to the operating speed of the semiconductor device 1, may be determined to significantly increase an operating speed. On the other hand, the second characteristic of the plurality of second transistors may be determined to significantly improve the performance of the semiconductor device 1 without considering the operating speed.

As an example, when each of the first characteristic and the second characteristic is a distance between gates defining transistors, a distance between first gates including the plurality of first transistors may be narrower than a distance between second gates including the plurality of second transistors. As an example, when each of the first characteristic and the second characteristic is a height of a cell including a transistor and a gate, a height of a first cell including the plurality of first transistors and a first gate may be smaller than a height of a second cell including the plurality of second transistors and a second gate. As an example, when each of the first characteristic and the second characteristic is the number of fin structures or a length of a nanosheet, the number of first fin structures included in the plurality of first transistors or a length of a first nanosheet may be smaller than the number of second fin structures included in the plurality of second transistors or a length of a second nanosheet.

Hereinafter, a description will be provided in which each of the first characteristic and the second characteristic of the semiconductor device 1 is a threshold voltage of a transistor. However, based on the above-described contents, example embodiments are not limited thereto and the first characteristic and the second characteristic may be another characteristic of the transistor, rather than the threshold voltage of the transistor.

Figure 4A:
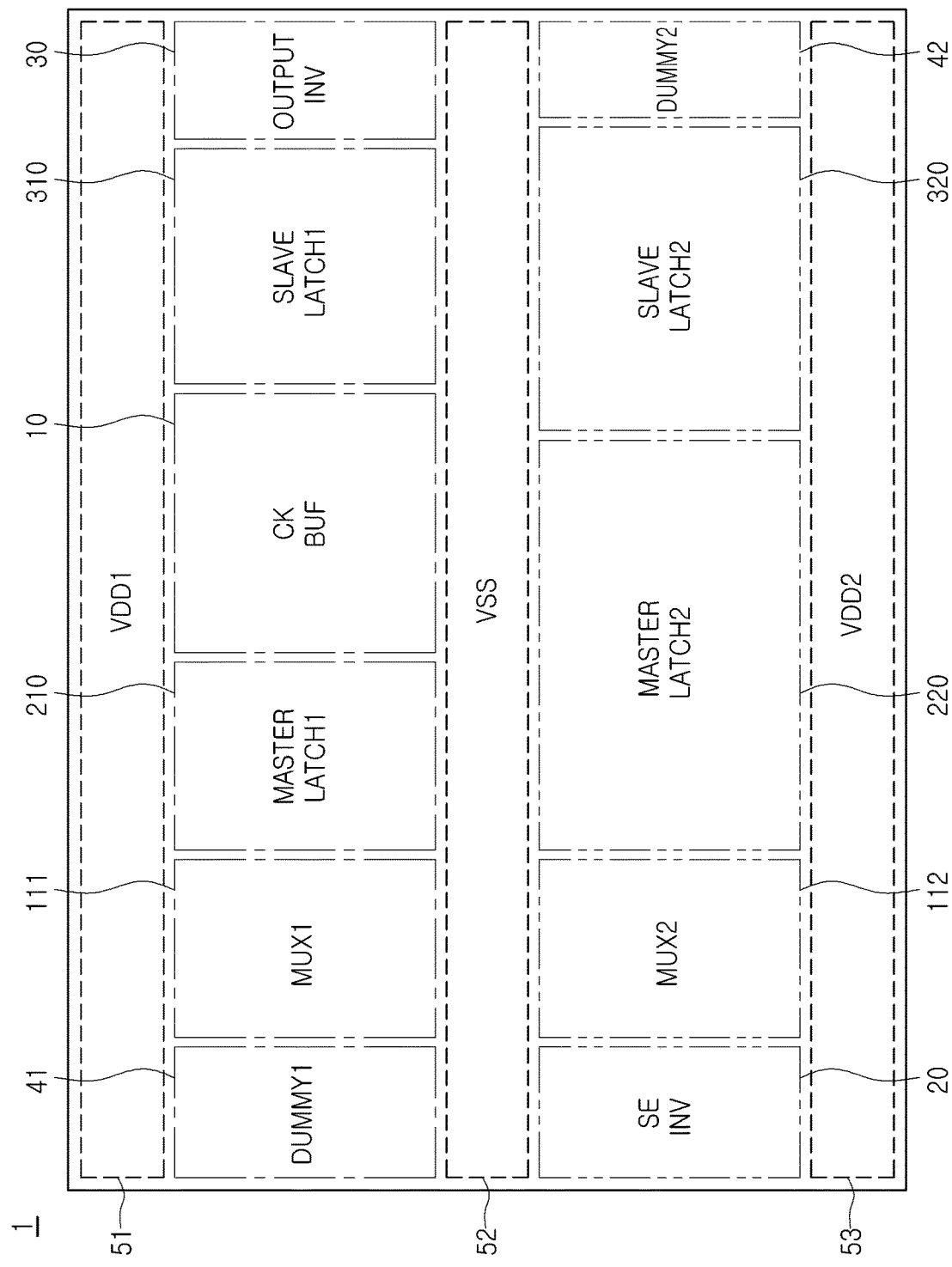
FIGS. 4A and 4B are block diagrams illustrating a simplified layout of a semiconductor device according to an example embodiment.
Figure 4B:
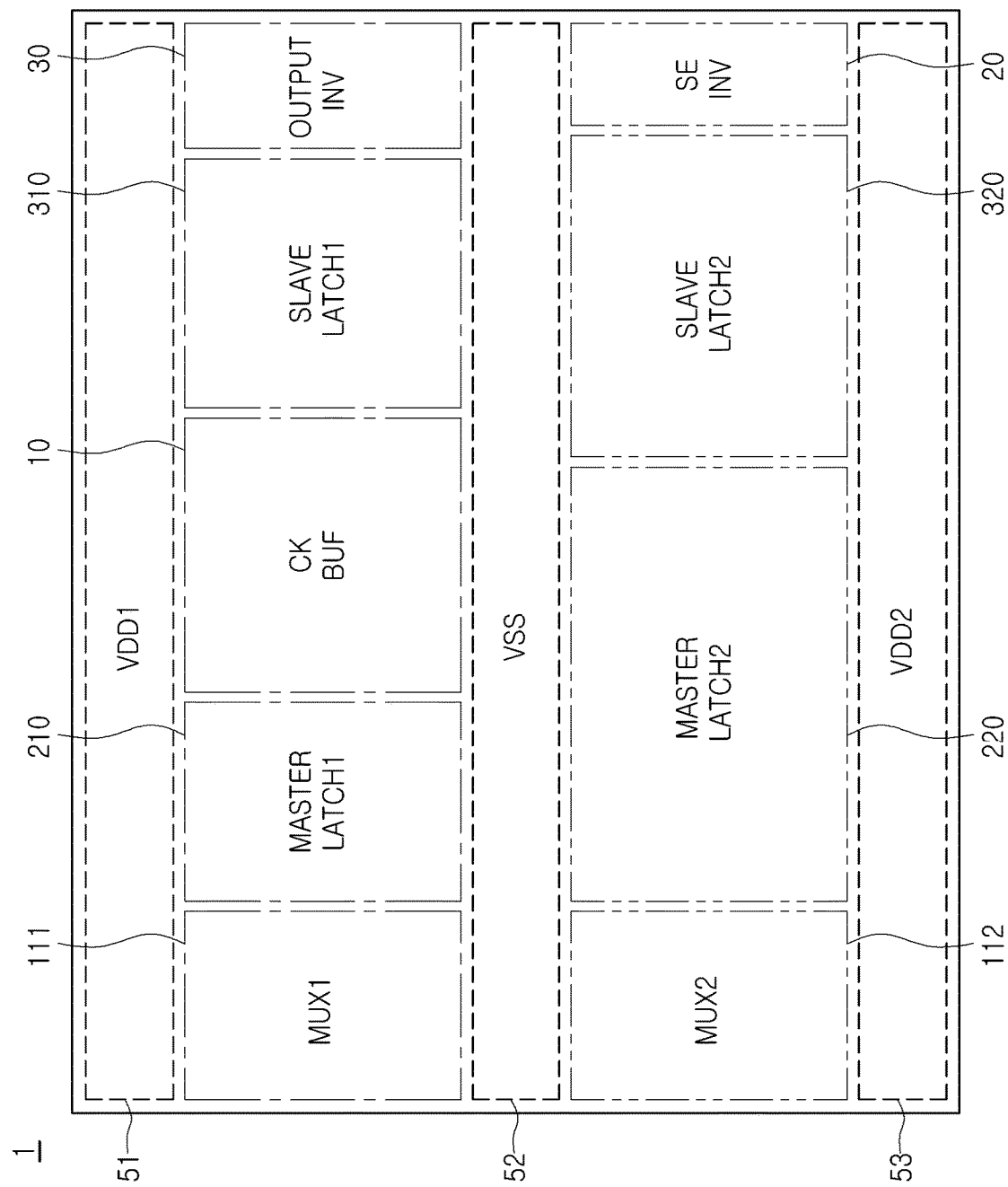

FIGS. 4A and 4B are block diagrams illustrating a simplified layout of a semiconductor device according to example embodiments.

Referring to FIG. 4A, a semiconductor device 1 according to an example embodiment may have a layout in which elements are separated depending on a threshold voltage. As an example, a layout of the semiconductor device 1 may include a first power supply line 51, a second power supply line 52, and a third power supply line 53. Operating voltages VDD1 and VDD2 may be input to the first power supply line 51 and the third power supply line 53, and a ground voltage VSS may be input to the second power supply line 52. The first to third power supply lines 51, 52, and 53 may extend in a first direction.

A region between the first power supply line 51 and the second power supply line 52 may be a first region, and a region between the second power supply line 52 and the third power supply line 53 may be a second region. A plurality of first transistors having a first threshold voltage may be disposed in the first region, and a plurality of second transistors having a second threshold voltage may be disposed in the second region.

As an example, a first circuit (MUX1) 111, a first master latch circuit (MASTER LATCH1) 210, a clock buffer (CK BUF) 10, and a first slave latch circuit (SLAVE LATCH1) 310, and an output inverter (OUTPUT INV) 30 may be sequentially disposed in the first region in a first direction. The first circuit 111 is a portion of a multiplexer circuit, the first master latch circuit 210 is a portion of a master latch circuit, and the first slave latch circuit 310 is a portion of a slave latch circuit. As an example, a clock buffer 10 may be disposed between the first master latch circuit 210 and the first slave latch circuit 310. The circuits, disposed in the first region, may correspond to circuit disposed on a data path illustrated in FIG. 3, respectively.

A scan enable signal inverter (SE INV) 20, a second circuit (MUX2) 112, a second master latch circuit (MASTER LATCH2) 220, and a second slave latch circuit (SLAVE LATCH2) 320 may be sequentially disposed in the second region in the first direction. The second circuit 112 is a remaining portion of the multiplexer circuit, the second master latch circuit 220 is a remaining portion of the master latch circuit, and the second slave latch circuit 320 is a remaining portion of the slave latch circuit. The circuits, disposed in the second region, may correspond to circuits disposed on a feedback path illustrated in FIG. 3, respectively.

In the layout of the semiconductor device 1, dummy regions 41 and 42 may be disposed in the same location as the scan enable signal inverter 20 and the output inverter 30 in a second direction, perpendicular to the power supply lines 51, 52, and 53. As an example, a first dummy region 41 may be disposed in the same location as the scan enable signal inverter 20 in a second direction, and a second dummy region 42 may be disposed in the same location as the output inverter 30 in the second direction.

However, the layout of the semiconductor device 1 may not be limited to that illustrated in FIG. 4A. As an example, at least a portion of the dummy regions 41 and 42 may include another circuit. As an example, another circuit which may be included in the dummy regions 41 and 42 may be a circuit for improving the performance of the semiconductor device 1, or a circuit for assisting in operations of the semiconductor device 1. Alternatively, another circuits which may be included in the dummy regions 41 and 42 may be a circuit for assisting in operation of a semiconductor chip in which the semiconductor device 1 is included.

The semiconductor device 1 may be a single standard cell. Accordingly, the layout of the semiconductor device 1 may vary depending on a required cell dimension. As an example, as shown in the semiconductor device 1 illustrated in FIG. 4B, the scan enable signal inverter 20 may be disposed in the location in which the second dummy region 42, illustrated in FIG. 4A, is disposed. Thus, the layout of the semiconductor device 1, defined as a single standard cell, may be reduced. In addition, the semiconductor device 1 may be configured using various combinations of circuits, other than the circuits illustrated in FIGS. 4A and 4B. As an example, in the layout illustrated in FIGS. 4A and 4B, the first region and the second region may be interchangeably disposed.

The semiconductor device 1 may be a single-bit flip-flop or a multi-bit flip-flop. As an example, at least one flip-flop circuit included in a multi-bit flip-flop may be laid out in the same manner as the semiconductor device 1. A plurality of elements, included in the multi-bit flip-flop, may share the scan enable inverter 20 and clock buffers 11 and 12. However, this is only an example and the present disclosure is not limited thereto. As necessary, the multi-bit flip-flop may be configured in various manners using the semiconductor device 1.

In addition, the semiconductor device 1 is not limited to a flip-flop, and may be another circuit having a layout separated according to characteristics of a transistor. As an example, at least a portion of the semiconductor device 1 may operate as a latch. The transistor may include transistors having different threshold voltages, and the number of fins or a length of a nanosheet may change depending on a difference in heights between respective regions in terms of layout.

FIGS. 5A to 5D are circuit diagram of elements included in a semiconductor device according to an example embodiment.

Figure 5A:
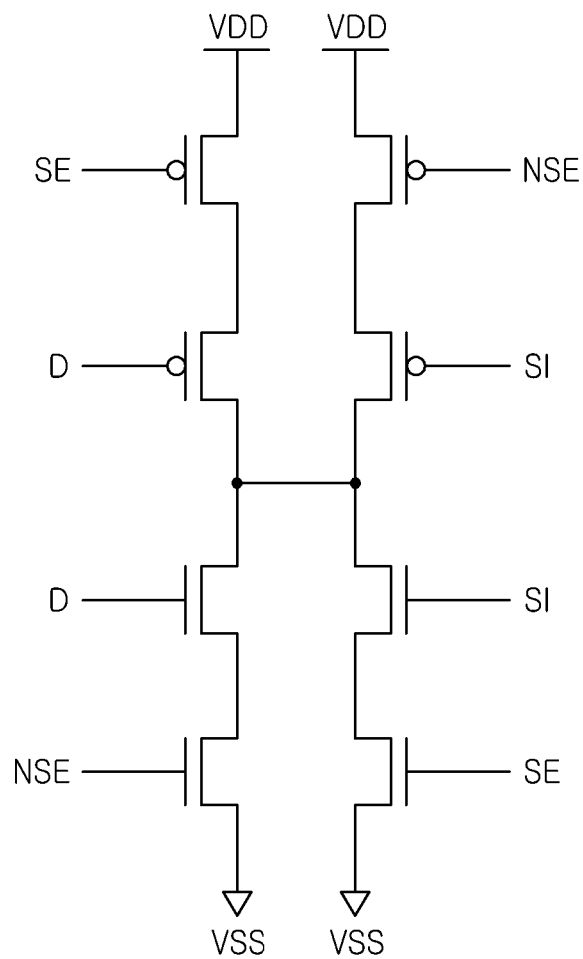
FIGS. 5A, 5B, 5C and 5D are circuit diagrams of elements included in a semiconductor device according to an example embodiment.

Referring to FIG. 5A, a scan circuit included in a semiconductor device according to an example embodiment may include a multiplexer circuit MUX. As an example, the multiplexer circuit MUX may include a first string structure and a second string structure connected between a power supply voltage VDD and a ground voltage VSS in series. Each of the first and second structures may include two PMOS transistors and two NMOS transistors. A first drain terminal, to which a PMOS transistor and an NMOS transistor are connected in the first string structure, and a second drain terminal, to which a PMOS transistor and an NMOS transistor are connected in the second string structure, may be connected to each other. Each of the first drain terminal and the second drain terminal may be an output node.

The first string structure may be a circuit to which a data signal D is input, and the second string structure may be a circuit to which a scan input signal SI is input. As an example, the data signal D may be input to a single PMOS transistor and a single NMOS transistor in the first string structure, and the scan input signal SI may be input to a single PMOS transistor and a single NMOS transistor in the second string structure.

A scan enable signal SE may be input to the other PMOS transistor of the first string structure and the other NMOS transistor of the second string structure to determine an output signal of the multiplexer circuit MUX. On the other hand, an inverted scan enable signal NSE may be input to the other NMOS transistor of the first string structure and the other PMOS transistor of the second string structure.

Figure 5B:
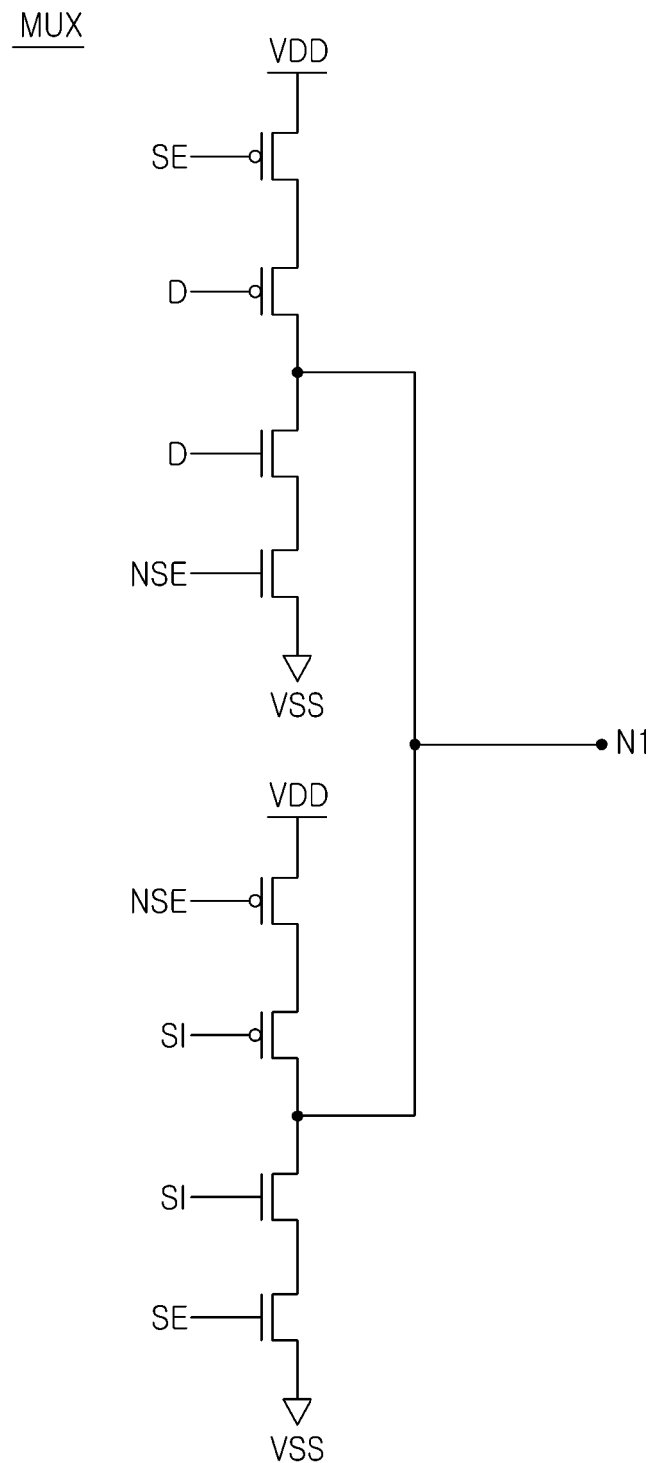

Referring to FIGS. 5B and 4A together, a multiplexer circuit MUX included in a semiconductor device according to an example embodiment may be divided into two parts depending on a threshold voltage of each transistor, included therein, to be respectively disposed in different regions in terms of layout. As an example, a first circuit receiving a data signal and a second circuit receiving a scan input signal may be disposed along a direction, perpendicular to power supply lines 51, 52, and 53.

Accordingly, the multiplexer circuit MUX included in the semiconductor device may be disposed along a straight line to share an output node N1. As an example, the first string structure may be disposed above the second string structure. A multiplexer circuit MUX illustrated in FIG. 5B may operate in the same manner as the multiplexer circuit MUX illustrated in FIG. 5A, but may have a different physical arrangement of components.

Figure 5C:
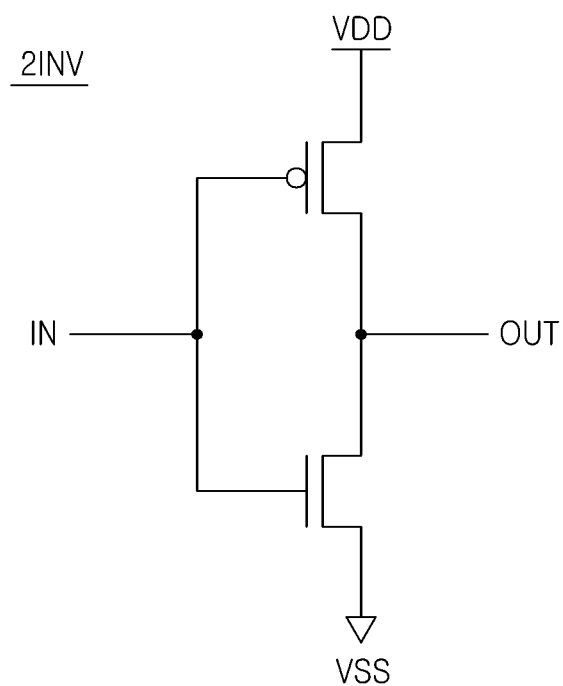

Referring to FIG. 5C, an inverter 2INV included in a semiconductor device according to an example embodiment may include a PMOS transistor and an NMOS transistor. The transistors may be connected between a power supply voltage VDD and a ground voltage VSS in series. Gates of each of the transistors, included in the inverter 2INV, may be connected to each other to provide an input node IN. Source/drain regions of each of the transistors, included in the inverter 2INV, may be connected to each other to provide an output node OUT. The inverter may invert an input signal, input to the input node IN, and may output the inverted signal to the output node OUT.

Figure 5D:
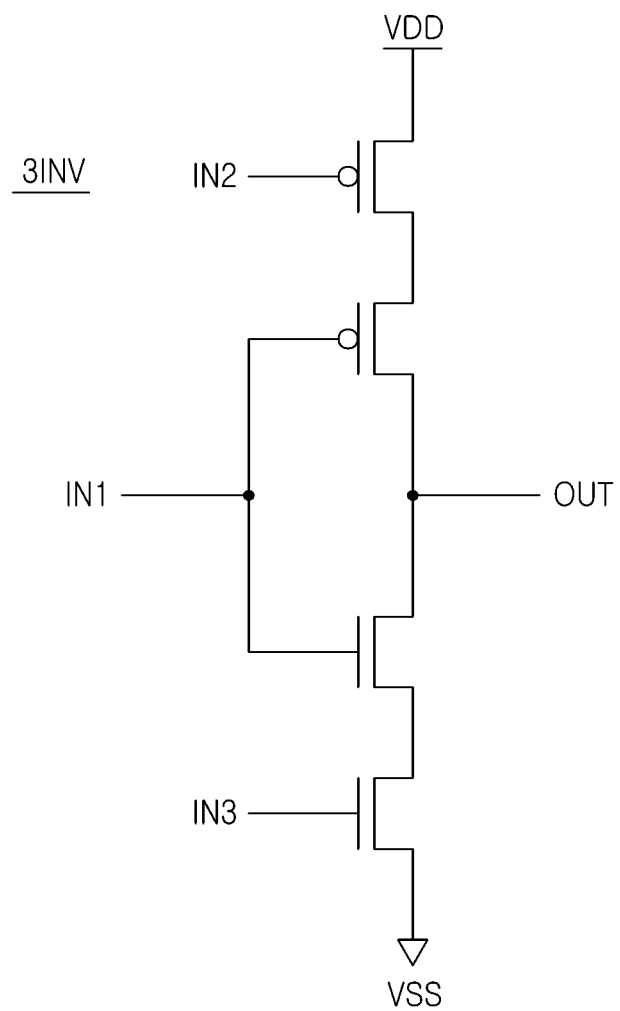

Referring to FIG. 5D, a three-state inverter 3INV, included in a semiconductor device according to an example embodiment, may include a first PMOS transistor, a second PMOS transistor, a first NMOS transistor, and a second NMOS transistor. The transistors may be connected between a power supply voltage VDD and a ground voltage VSS in series. As described above, the three-state inverter may control an operation of inverting a signal input to a first input node IN1 and outputting the inverted signal to an output node OUT using the first PMOS transistor, turned on and turned off by a signal input to a second input signal IN2, and the second NMOS transistor turned on and turned off by a signal input to a third input node IN3.

Figure 6:
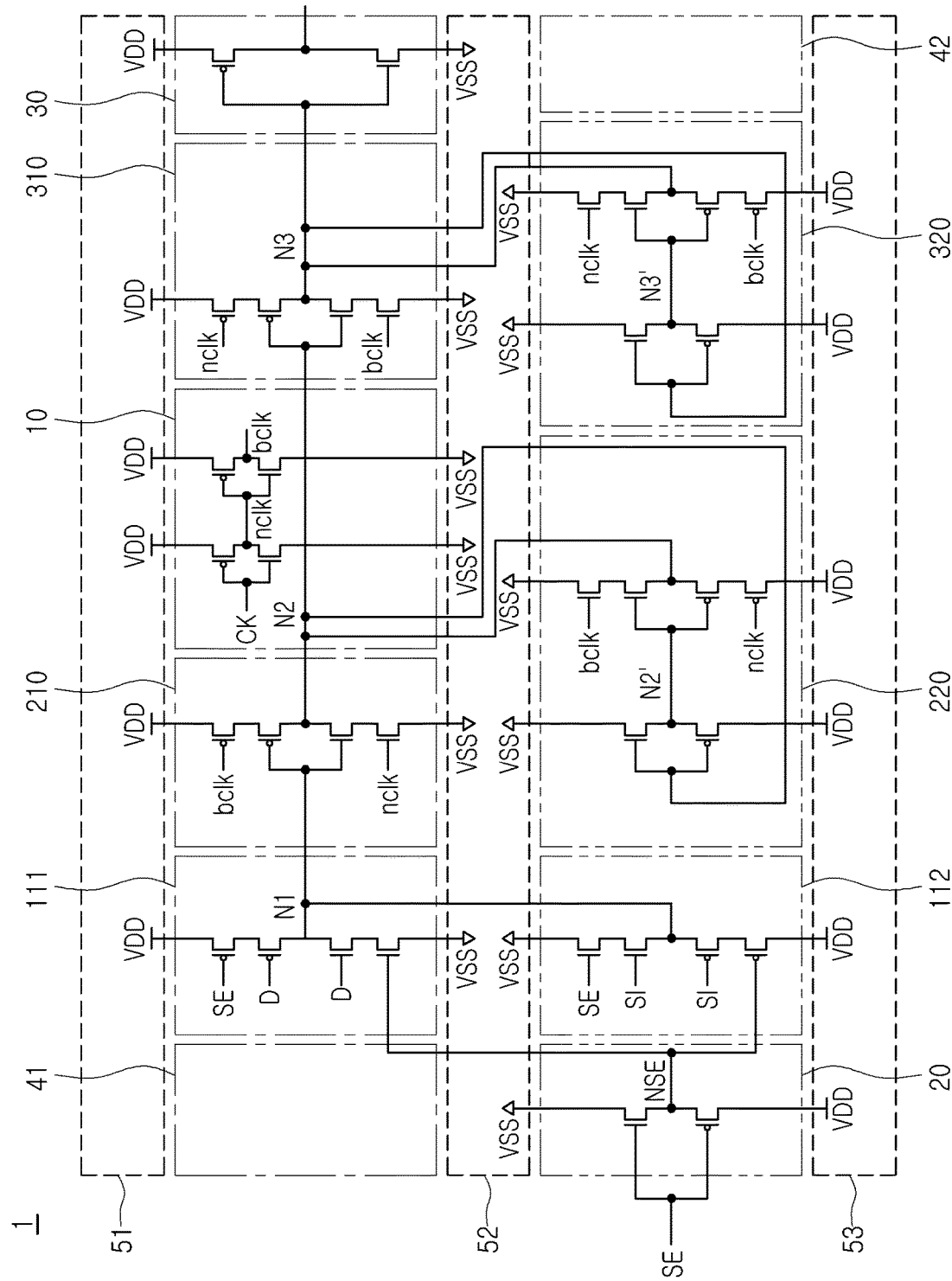
FIG. 6 is a circuit diagram of a semiconductor device according to an example embodiment.

FIG. 6 is a circuit diagram of a semiconductor device according to an example embodiment.

Referring to FIGS. 4A, 5B, 5C, 5D and 6, a semiconductor device 1 according to an example embodiment may be designed in consideration of the circuit diagrams illustrated in FIGS. 5B, 5C and 5D and the layout illustrated in FIG. 4A.

As an example, an output node of a scan enable inverter 20 may be connected to one transistor, among transistors included in a first circuit 111, and one transistor, among transistors included in a second circuit 112. The first circuit 111 and the second circuit 112, included in a multiplexer circuit 111 and 112, may share a first node N1 as an output node. The first node N1 may be an input node of a first master latch circuit 210, and an output node of the first master latch circuit 210 may be a second node N2. The second node N2 may be an input/output node of a second master latch circuit 220, and may also be an input node of a first slave latch circuit 310. An output node of the first slave latch circuit 310 may be a third node N3. The third node N3 may be an input/output node of the second slave latch circuit 320, and may also be an input node of an output inverter 30.

A clock buffer 10 may be connected to gates of some transistors, among transistors included in the master latch circuits 210 and 220 and the slave latch circuits 310 and 320. A first clock signal bclk and a second clock signal nclk, output from the clock buffer 10 may be respectively input to the gates of some transistors.

The circuits, included in the semiconductor device 1, may share power supply lines 51, 52, and 53. Transistors may be separately disposed in four regions in a second direction, perpendicular to the power supply lines 51, 52, and 53. Each of the four regions may include a plurality of transistors having similar characteristics. A plurality of transistors, included in each of the four regions, may have different characteristics.

As an example, transistors disposed to be close to the first power supply line 51 between the first power supply line 51 and the second power supply line 52 may be PMOS transistors having a first threshold voltage. Transistors disposed to be close to the second power supply line 52 between the first power supply line 51 and the second power supply line 52 may be NMOS transistors having the first threshold voltage. Transistors disposed to be close to the second power supply line 52 between the second power supply line 52 and the third power supply line 53 may be NMOS transistors having a second threshold voltage, higher than the first threshold voltage. Transistors disposed between the second power supply line 52 and the third power supply line 53 to be close to the third power supply line 53 may be PMOS transistors having the second threshold voltage.

FIGS. 7 to 10 are layout diagrams of a semiconductor device according to an example embodiment.

Figure 7:
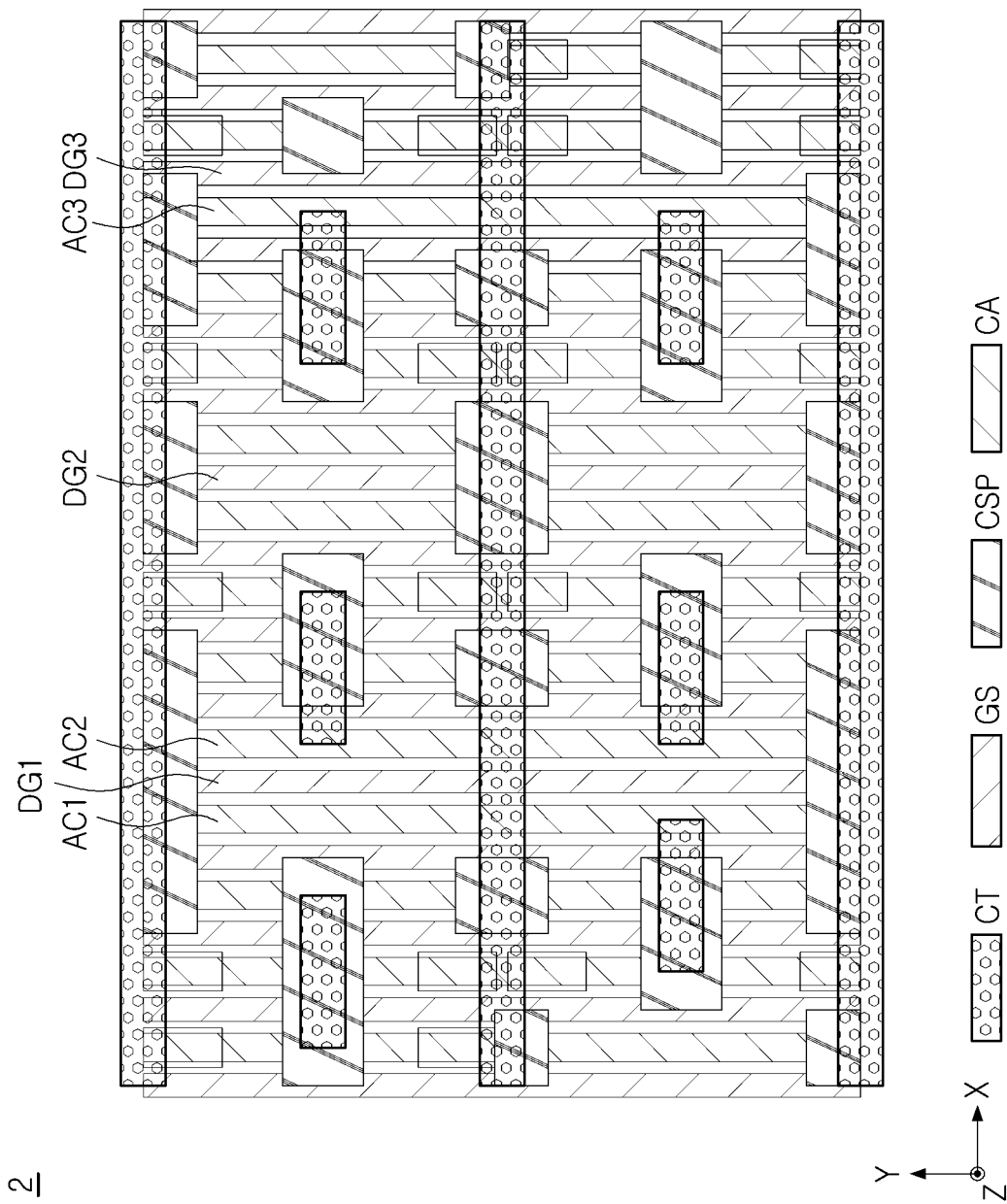
FIGS. 7 to 10 are layout diagrams of a semiconductor device according to an example embodiment.

FIG. 7 may be a layout diagram for designing a semiconductor device 2 according to an example embodiment. Referring to FIG. 7, the semiconductor device 2 may include a plurality of gate lines GS, active regions, a plurality of active contacts CA, gate separation patterns CT, and active contact separation patterns CSP disposed in an X direction and a Y direction. The active regions may extend in a direction, intersecting the plurality of gate lines GS, while having a continuous pattern.

In the semiconductor device 2, the plurality of gate lines GS and the plurality of active contacts CA may be alternately disposed along the X direction and may extend in the Y direction. The plurality of active contacts CA may be connected to active regions.

As an example, each of the plurality of gate lines GS may have a thickness of 4 nm, and each of the plurality of active contacts CA may have a thickness of 20 nm. A spacer may be disposed between the plurality of gate lines GS and the plurality of active contacts CA. However, this is only an example, and the present disclosure is not limited thereto. The thicknesses and arrangements of the plurality of gate lines GS and the plurality of active contacts CA may change according to processes.

The plurality of gate lines GS may be separated by the gate separation patterns CT. For example, the gate separation pattern CT may extend in the X direction, and the semiconductor device 2 according to an example embodiment may be distinguished from neighboring semiconductor devices by the gate separation pattern CT. The plurality of active contacts CA may be separated by active contact separation patterns CSP.

As an example, to design the semiconductor device 2 illustrated in FIG. 7, the semiconductor device 2 may include active contacts AC1, AC2, and AC3, extending in the Y direction without being separated into a plurality of active contacts CA by the active contact separation pattern CSP, among the active contacts CA. As an example, the active contacts CA may include a first active contact AC1, a second active contact AC2, and a third active contact AC3.

The semiconductor device 2 may include dummy gate lines DG1, DG2, and DG3 according to the necessity for distinguishing with neighboring semiconductor devices and/or for a layout. As an example, to design the semiconductor device 2 illustrated in FIG. 7, a first dummy gate line DG1 may be disposed between the first active contact AC1 and the second active contact A2, a second dummy gate line DG2 may be disposed between the second active contact AC2 and the third active contact AC3, and a third dummy gate line DG3 may be disposed on one side of the third active contact. However, this is only an example, and the present disclosure is not limited thereto. The number and arrangement of the dummy gate lines DG1, DG2, and DG3 may be changed.

Figure 8:
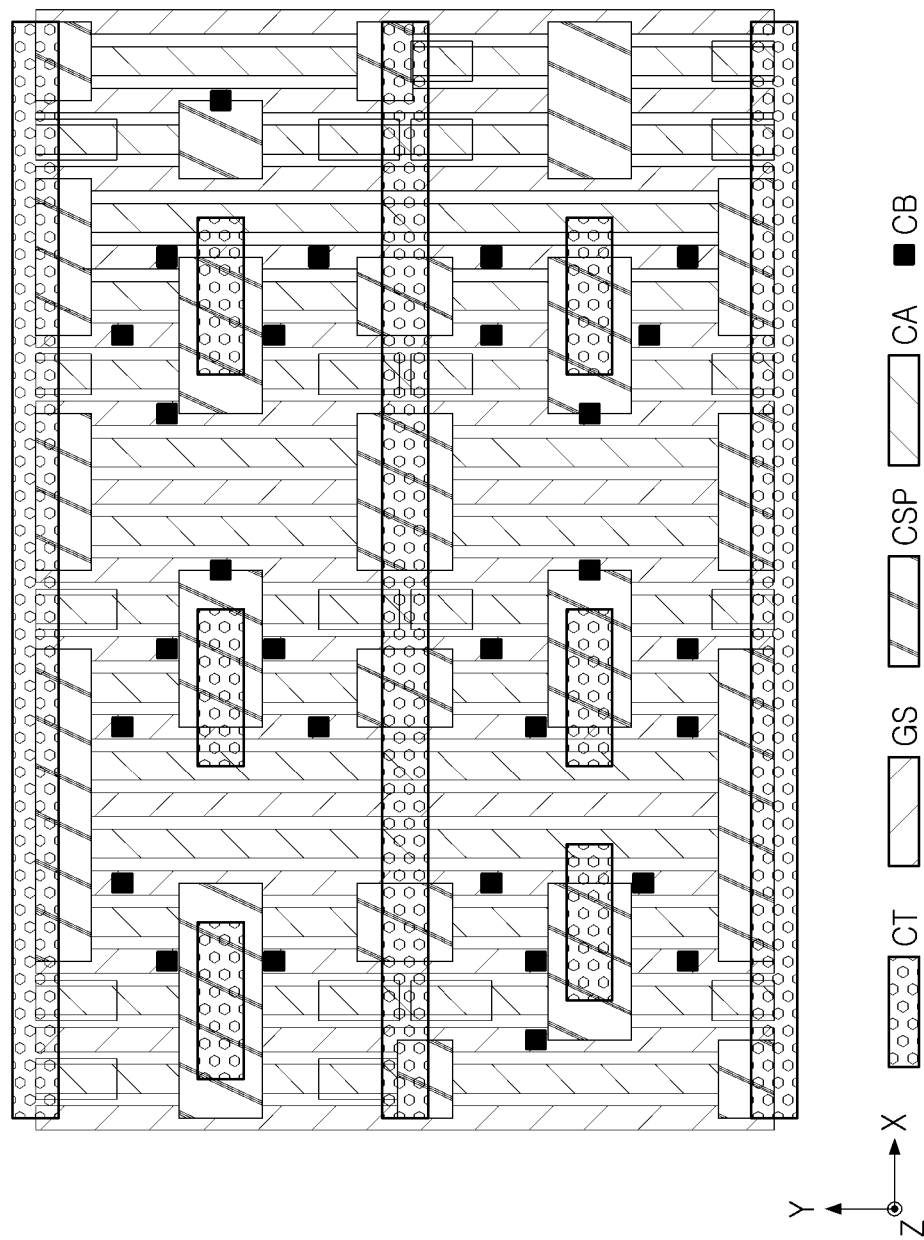
Figure 9:
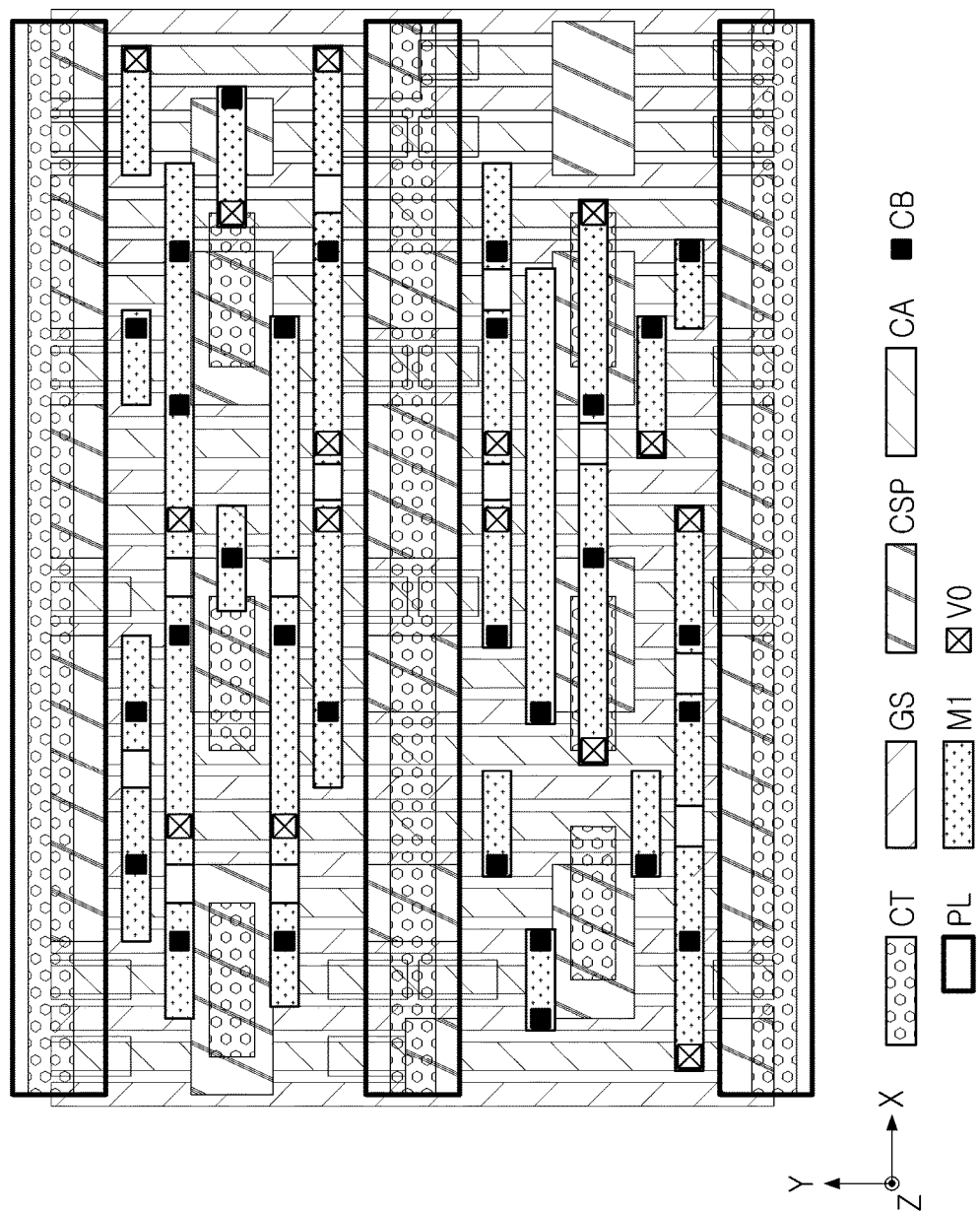

FIG. 8 may be a layout diagram in which gate contacts CB are added to the layout of FIG. 7. FIG. 9 may be a layout diagram in which power supply lines PL, first interconnection lines M1, and lower vias V0, connecting the active contacts CA and first interconnection lines M1 to each other, are added to the layout of FIG. 8.

The gate contacts CB may be disposed on a plurality of gate lines GS to connect the plurality of gate lines GS and the first interconnection lines M1 to each other. The lower vias V0 may be disposed on the plurality of active contacts CA to connect the plurality of active contacts CA and the first interconnection lines M1 to each other.

The first interconnection lines M1 may be disposed on the active regions and the gate lines GS, and may extend in an X direction. The first interconnection lines M1 may be disposed at the same height as power supply lines PL. However, this is only an example, and the present disclosure is not limited thereto. The first interconnection lines M1 may include power supply lines PL.

The power supply lines PL may supply a first voltage and a second voltage, different from each other, to the semiconductor device 2, respectively. The power supply lines PL may be electrically connected to source/drain regions on the active regions through the lower vias V0. As an example, a high-power supply line may supply the first voltage to the semiconductor device 2, and a low-power supply line may supply the second voltage, lower than the first voltage, to the semiconductor device 2.

The semiconductor device 2 may be divided into a first region and a second region by the power supply line PL. As an example, the first region may include a plurality of first transistors having a first threshold voltage, and the second region may include a plurality of second transistors having a second threshold voltage. As an example, the first threshold voltage may be lower than the second threshold voltage.

In the semiconductor device 2, each of the first region and the second region may be subdivided into two regions in a Y direction by the gate separation patterns CT and the active contact separation patterns CSP. Therefore, a transistor may be included in each of the subdivided regions in which a plurality of gate lines GS and a plurality of active contacts CA are disposed. As an example, a single transistor may be defined by a single gate line GS and a pair of active contacts CA, disposed on opposite sides of the single gate line GS. Each of the subdivided regions may include four transistors in the Y direction. However, this is only an example, and the present disclosure is not limited thereto. The number of included transistors may change depending on a direction.

Figure 10:
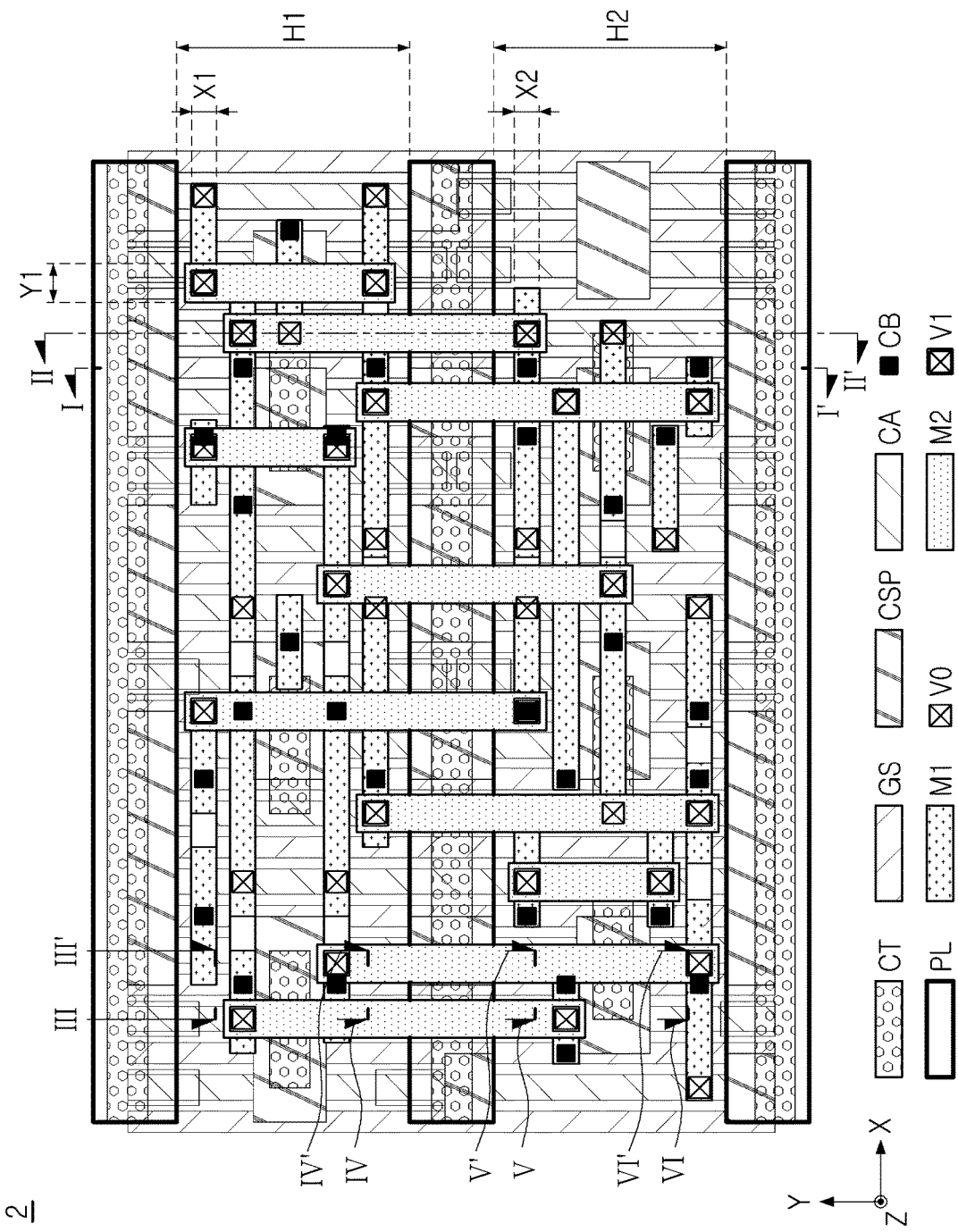

FIG. 10 may be a layout diagram in which second interconnection lines M2 and first vias V1, connecting the first interconnection lines M1 and the second interconnection lines M2 to each other, are added to the layout diagram of FIG. 9. The second interconnection lines M2 may extend in a Y direction, perpendicular to the first interconnection lines M1, and may be connected to the first interconnection lines M1 through the first vias V1.

In the semiconductor device 2, a length H1 of the first region in the Y direction and a length H2 of the second region in the Y direction may be the same. Therefore, each of the first interconnection lines M1 in the first region may have the same width as each of the first interconnection lines M1 in the second region. However, the present disclosure is not limited thereto, and the first interconnection lines M1 may be designed to have different widths in consideration of circuit functions in the semiconductor device 1. As an example, among the first interconnection lines M1, the first interconnection lines M1 included in the first region may each have a thickness X1 and the first interconnection lines M1 included in the second region may each have a thickness X2 equal to the thickness X1. On the other hand, the thickness of each of the second interconnection lines M2 may be Y1 greater than X2.

Figure 11:
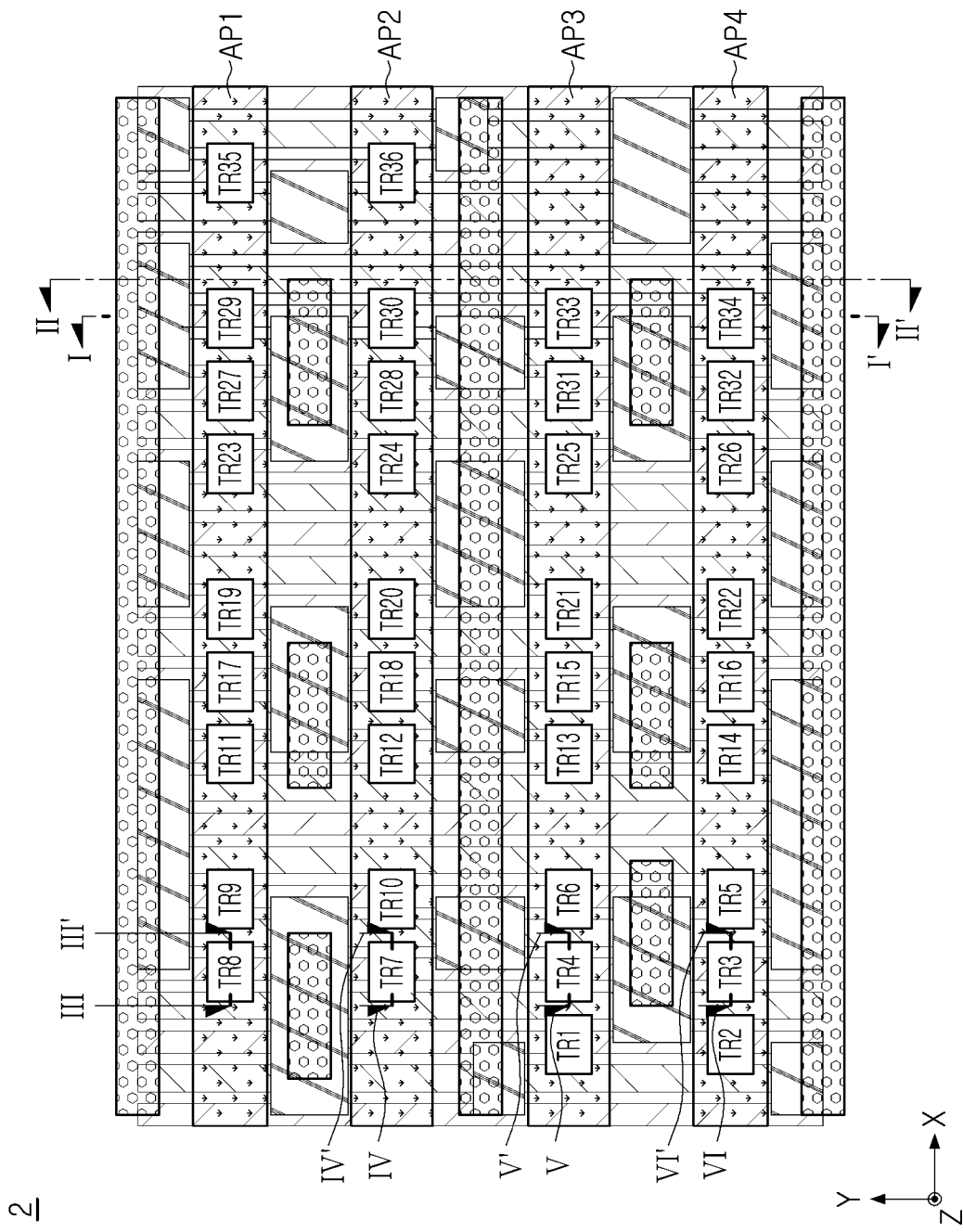
FIGS. 11 and 12 are views illustrating placement of transistors included in a semiconductor device according to an example embodiment.
Figure 12:
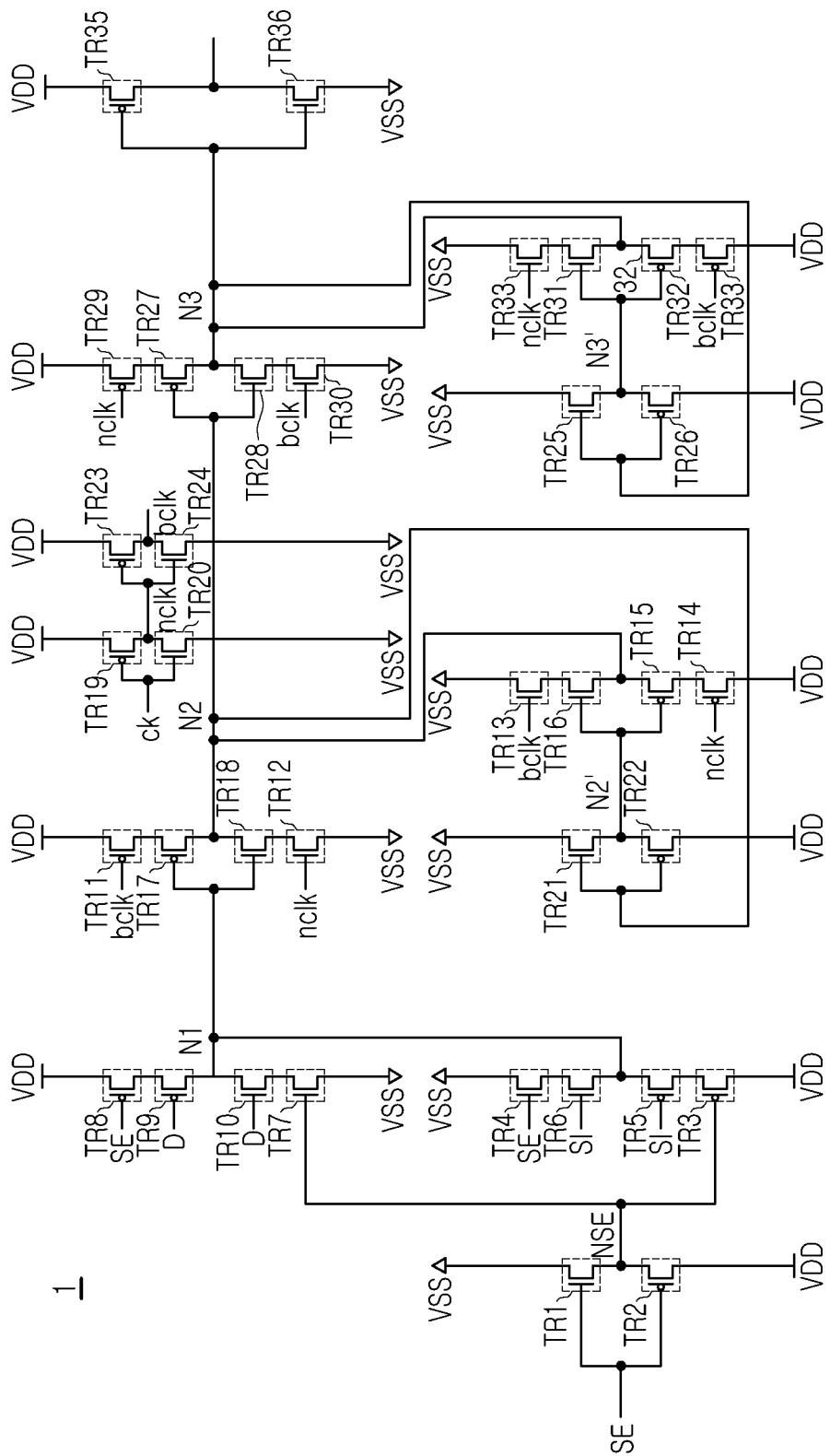

FIGS. 11 and 12 are views illustrating placement of transistors included in a semiconductor device according to an example embodiment.

Referring to FIG. 11, the semiconductor device 2 according to an example embodiment may be divided into four regions along a y direction, as described above. For example, active regions AP1, AP2, AP3, and AP4 may be defined along they direction. Each of the active regions AP1, AP2, AP3, and AP4 may provide a source/drain region of a transistor.

Active regions may be disposed in well regions having different conductivity types, and may be connected to contacts disposed thereon. Active regions, disposed in N-well regions, may have an N-type conductivity and active regions, not disposed in the N-well regions, may have a P-type conductivity.

As an example, a first active region AP1 may not be disposed in the N-well region and may include source/drain regions of PMOS transistors having a first threshold voltage. The second active region AP2 may be disposed in the N-well region and may include source/drain regions of NMOS transistors having the first threshold voltage. The third active region AP3 may be disposed in the N-well region and may include source/drain regions of NMOS transistors having a second threshold voltage, higher than the first threshold voltage. The fourth active region AP4 may not be disposed in the N-well region and may include source/drain regions of PMOS transistors having the second threshold voltage.

Referring to FIG. 12, the semiconductor device 2 according to an example embodiment may include 36 transistors TR1 to TR36 to implement a plurality of circuits. However, this is only an example, and the present disclosure is not limited thereto. According to example embodiments, the semiconductor device 2 may include more or less than 36 transistors.

A plurality of transistors TR1 to TR36, illustrated in the circuit diagram of FIG. 12, may correspond to the transistors TR1 to TR36 disposed in the layout of FIG. 11. As described above, in the semiconductor device 1, transistors included in a circuit disposed on a data path having a relation to operating speed may be disposed on the first active region AP1 and the second active region AP2, and transistors included in a circuit disposed on a feedback path may be disposed on the third active region AP3 and the fourth active region AP4.

Figure 13:
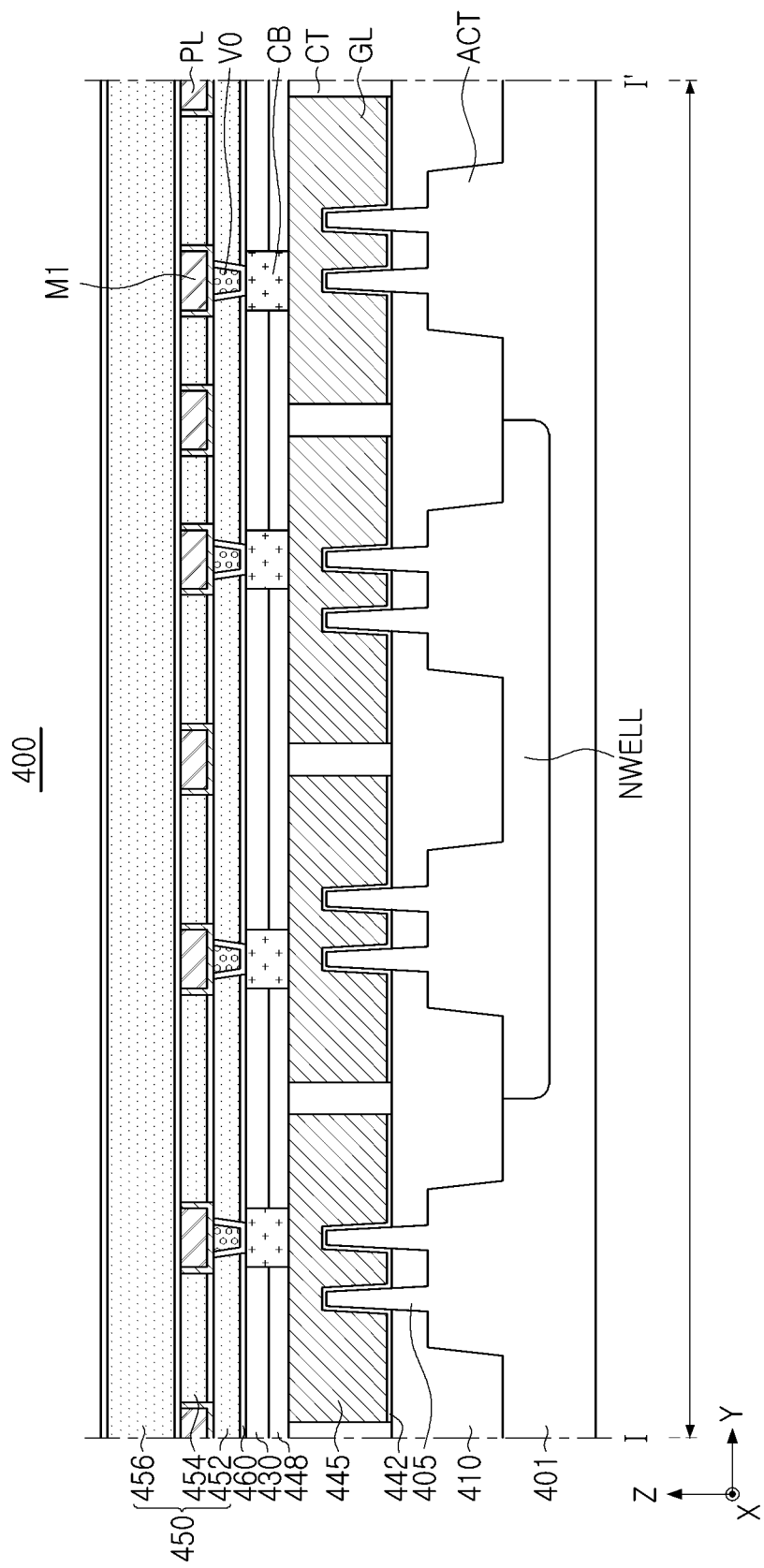
FIGS. 13 and 14 are cross-sectional views illustrating a semiconductor device according to an example embodiment.
Figure 14:
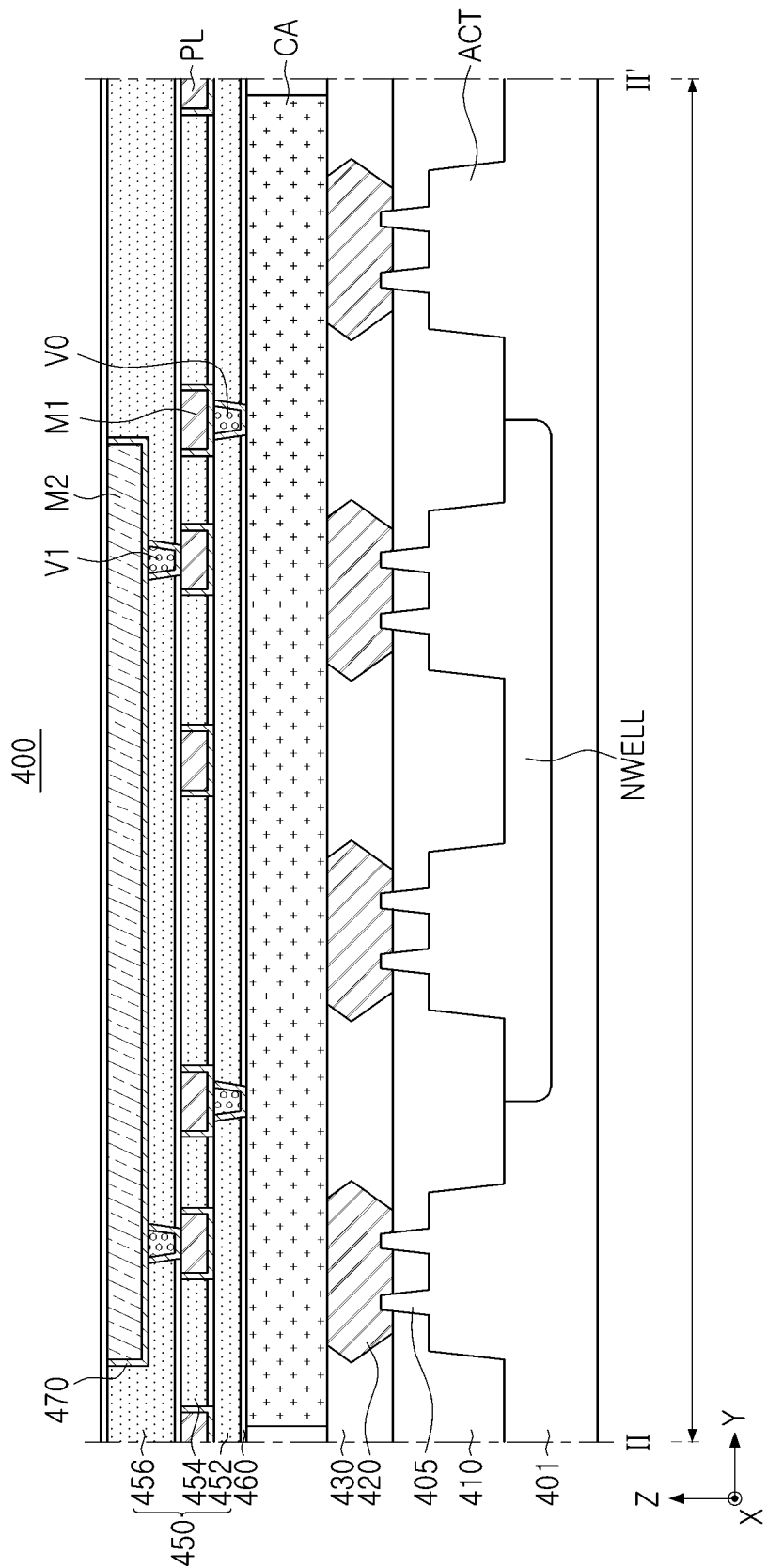

FIGS. 13 and 14 are cross-sectional views illustrating a semiconductor device according to an example embodiment.

FIGS. 13 and 14 illustrate exemplary cross sections of the semiconductor device 2, illustrated in FIG. 11, taken along lines I-I' and II-IF of FIG. 11. For ease of description, only main components of the semiconductor device 2 are illustrated in FIGS. 13 and 14.

Referring to FIGS. 13 and 14, a semiconductor device 400 according to an example embodiment may include a substrate 401, active regions ACT including active fins 405, and a device isolation layer 410, source/drain regions 420, gate insulating layer 442, a gate electrode layer 445, gate capping layer 448, gate line separation pattern CT, a lower interlayer insulating layer 430, an active contact CA, a gate contact CB, an upper interlayer insulating layer 450, lower vias V0, first interconnection lines M1, first vias V1 disposed on the first interconnection lines M1, and second interconnection lines M2. The semiconductor device 400 may further includes etch-stop layers 460, disposed on a lower surface of the upper interlayer insulating layer 450, and barrier layers 470 disposed along lower surfaces of the interconnection lines M1 and M2 and vias V0 and V1. The semiconductor device 400 may include FinFET elements, each being a transistor in which active regions ACT include active fins 405 having a fin structure.

The substrate 401 may have an upper surface extending in an X direction and a Y direction. The substrate 401 may include a semiconductor material such as a group IV semiconductor, a group III-V compound semiconductor, or a group II-VI compound semiconductor. For example, the group IV semiconductor may include silicon, germanium, or silicon-germanium. The substrate 401 may be provided as a bulk wafer, an epitaxial layer, a silicon-on-insulator (SOI) layer, or a semiconductor-on-insulator (SeOI) layer. The substrate 401 may include doped regions such as an N-well region NWELL.

The device isolation layer 410 may define active regions ACT in the substrate 401. The device isolation layer 410 may be formed by, for example, a shallow trench isolation (STI) process. As illustrated in FIGS. 13 and 14, the device isolation layer 410 may include a region extending more deeply into the substrate 401 between adjacent active regions ACT, but the present disclosure is not limited thereto. According to example embodiments, the device isolation layer 410 may have a curved upper surface having a level increased in a direction toward the active fins 405. The device isolation layer 410 may be formed of an insulating material and may include, for example, an oxide, a nitride, or a combination thereof.

The active regions ACT may be defined by the device isolation layer 410 in the substrate 401 and may be disposed to extend in a first direction, for example, the X direction. The active fins 405 may have a shape protruding from the substrate 401. Upper ends of the active fins 405 may be disposed to protrude from an upper surface of the device isolation layer 410 to a predetermined height. The active fins 405 may be provided as a portion of the substrate 401, or may include an epitaxial layer grown from the substrate 401. A portion of the active fins 405 may be recessed on both sides of the gate structures GL, and source/drain regions 420 may be disposed on the recessed active fins 405. According to example embodiments, the active regions ACT may have doped regions including impurities. For example, the active fins 405 may include impurities diffused from the source/drain regions 420 in a region in contact with the source/drain regions 420. As an example, the active fins 405 may be omitted. In this case, the active regions ACT may have a structure having a planar upper surface.

The source/drain regions 420 may have a merged shape in which they are connected to each other between adjacent active fins 105 in the Y direction, but the present disclosure is not limited thereto. In example embodiments, the source/drain regions 420 may have various shapes, and may have one of, for example, polygonal, circular, elliptical, and rectangular shapes.

The source/drain regions 420 may be provided as an epitaxial layer, and may include, for example, silicon (Si), silicon germanium (SiGe), or silicon carbide (SiC). The source/drain regions 120 may further include impurities such as arsenic (As) and/or phosphorus (P). In example embodiments, the source/drain regions 420 may include a plurality of regions including elements having different concentrations and/or doping elements.

The gate structures GL may be disposed to extend in the Y direction while intersecting the active regions ACT above the active regions ACT. Channel regions of transistors may be formed in the active fins 405 intersecting the gate structures GL. The gate structure GL may include a gate insulating layer 442, a gate electrode layer 445, gate spacer layers, and a gate capping layer 448.

A threshold voltage of a transistor may be determined by a configuration of the gate structure GL. In the semiconductor device 400 according to an example embodiment, a threshold voltage of an included transistor may be designed to be different for each region disposed in terms of layout. Therefore, shapes of gate structures GL, included in transistors, may be different from each other. Contents, related to the threshold voltage of the transistor depending on the shape of the gate structure GL, will be described later.

The gate insulating layer 442 may be disposed between the active fins 405 and the gate electrode layer 445. In example embodiments, the gate insulating layer 442 may include a plurality of layers or may be disposed to extend upwardly of a side surface of the gate electrode layer 445. The gate insulating layer 442 may include an oxide, a nitride, or a high-k dielectric material. The high-k dielectric material may refer to a dielectric material having a higher dielectric constant than a silicon oxide ($SiO_2$).

The gate electrode layer 445 may include a conductive material, for example, a metal nitride such as titanium nitride (TiN), tantalum nitride (TaN), or tungsten nitride (WN), and/or a metallic material such as aluminum (Al), tungsten (W), or molybdenum (Mo), or a semiconductor material such as doped polysilicon. The gate electrode layer 445 may have a multilayer structure including two or more layers. According to a circuit configuration of the semiconductor device 400, the gate electrode layer 445 may be disposed to be separated from each other between at least some adjacent transistors in the Y direction. For example, the gate electrode layer 445 may be separated by an additional gate separation layer.

Gate spacer layers may be disposed on opposite sides of the gate electrode layer 445. The gate spacer layers may insulate the source/drain regions 420 and the gate electrode layer 445 from each other. According to example embodiments, the gate spacer layers may have a multilayer structure. The gate spacer layers may be formed of an oxide, a nitride, and an oxynitride. In particular, the gate spacer layers may be formed of a low-k dielectric material. The gate spacer layers may include, for example, any one or any combination of SiO, SiN, SiCN, SiOC, SiON, and SiOCN.

The gate capping layer 448 may be disposed on the gate electrode layer 445, and may have a lower surface and side surfaces, respectively surrounded by the gate electrode layer 445 and the gate spacer layers. The gate capping layer 448 may be formed of, for example, an oxide, a nitride, and an oxynitride.

The lower interlayer insulating layer 430 may be disposed to cover the source/drain regions 420 and the gate structures GL. The lower interlayer insulating layer 430 may include any one or any combination of, for example, an oxide, a nitride, and an oxynitride, and may include a low-k dielectric material.

The active contact CA and the gate contact CB may penetrate through the lower interlayer insulating layer 430 to be connected to the source/drain regions 420, or may penetrate through the lower interlayer insulating layer 430 and the gate capping layer 448 to be connected to the gate electrode layer 445, and may apply an electrical signal to the source/drain regions 420 and the gate electrode layer 445. The active contact CA and the gate contact CB may be disposed to recess the source/drain regions 420 to a predetermined depth, but the present disclosure is not limited thereto. The active contact CA and the gate contact CB are formed of a conductive material, for example, a metallic material such as tungsten (W), aluminum (Al), copper (Cu), or the like, or a semiconductor material such as doped polysilicon. According to example embodiments, the active contact CA and the gate contact CB may include a barrier metal layer disposed along an external surface. According to example embodiments, the active contact CA and the gate contact CB may further include a metal-semiconductor layer such as a silicide layer disposed on an interface in contact with the source/drain regions 420 and the gate electrode layer 445.

The upper interlayer insulating layer 450 may cover the active contact CA and the gate contact CB, and may be disposed on the same level as an interconnection structure including the lower vias V0, the first interconnection lines M1, the first vias V1, and the second interconnection lines M2. The upper interlayer insulating layer 450 may include first, second, and third insulating layers 452, 454, and 456, respectively disposed on the same levels as the lower vias V0, the first interconnection lines M1, and the first vias V1. The upper interlayer insulating layer 450 may be formed of a silicon oxide or a low-k dielectric material. The upper interlayer insulating layer 450 may include any one or any combination of, for example, SiO, SiN, SiCN, SiOC, SiON, and SiOCN.

The etch-stop layers 460 may be disposed on a lower surface of each of the first, second, and third insulating layers 452, 454, and 456. The etch-stop layers 460 may serve as an etch-stop layer in an etching process for forming the lower vias V0, the first interconnection lines M1, the first vias V1, and the second interconnection lines M2. Each of the etch-stop layers 460 may include a high-k material, for example, a silicon nitride or an aluminum oxide.

The lower vias V0, the first interconnection lines M1, the first vias V1, and the second interconnection lines M2, constituting the interconnection structure, may be sequentially stacked from below. The first interconnection lines M1 and the second interconnection lines M2, stacked upwardly, may have a thickness relatively increased in a direction upwards, but the present disclosure is not limited thereto. Each of the interconnection structures may include a conductive material. For example, each of the interconnection structures may include any one or any combination of aluminum (Al), copper (Cu), and tungsten (W).

The barrier layers 470 may be disposed along lower surfaces of the interconnection lines M1 and M2 and the vias V0 and V1 within the interconnection structure. Specifically, the barrier layers 470 are disposed along a lower surface and side surfaces of each of the lower vias V0, the first interconnection lines M1, the first vias V1, and the second interconnection lines M2. In particular, the barrier layers 470 may continuously extend from the side surfaces and the lower surface of the second interconnection lines M2 to the lower surfaces of the first vias V1 along the side surfaces of the first vias V1. The barrier layers 470 may include any one or any combination of titanium (Ti), tantalum (Ta), cobalt (Co), titanium nitride (TiN), and tantalum nitride (TaN).

Figure 15:
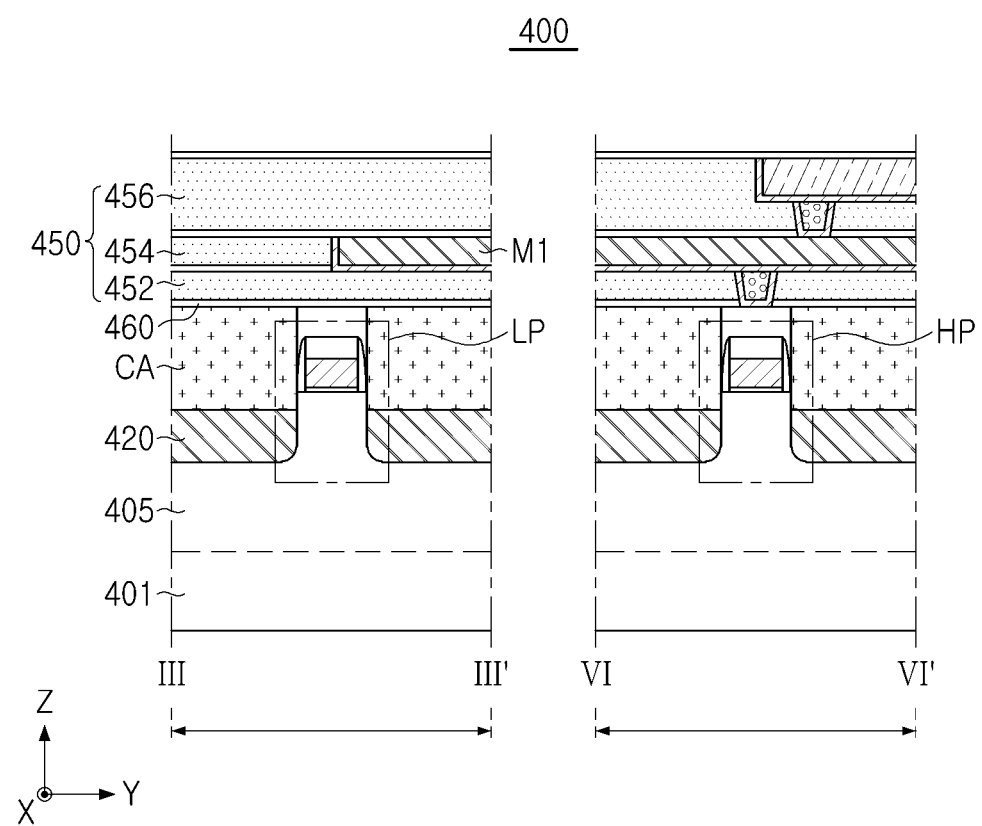
FIGS. 15, 16A and 16B are cross-sectional views of PMOS transistors depending on a threshold voltage, in semiconductor devices according to example embodiments.
Figure 16A:
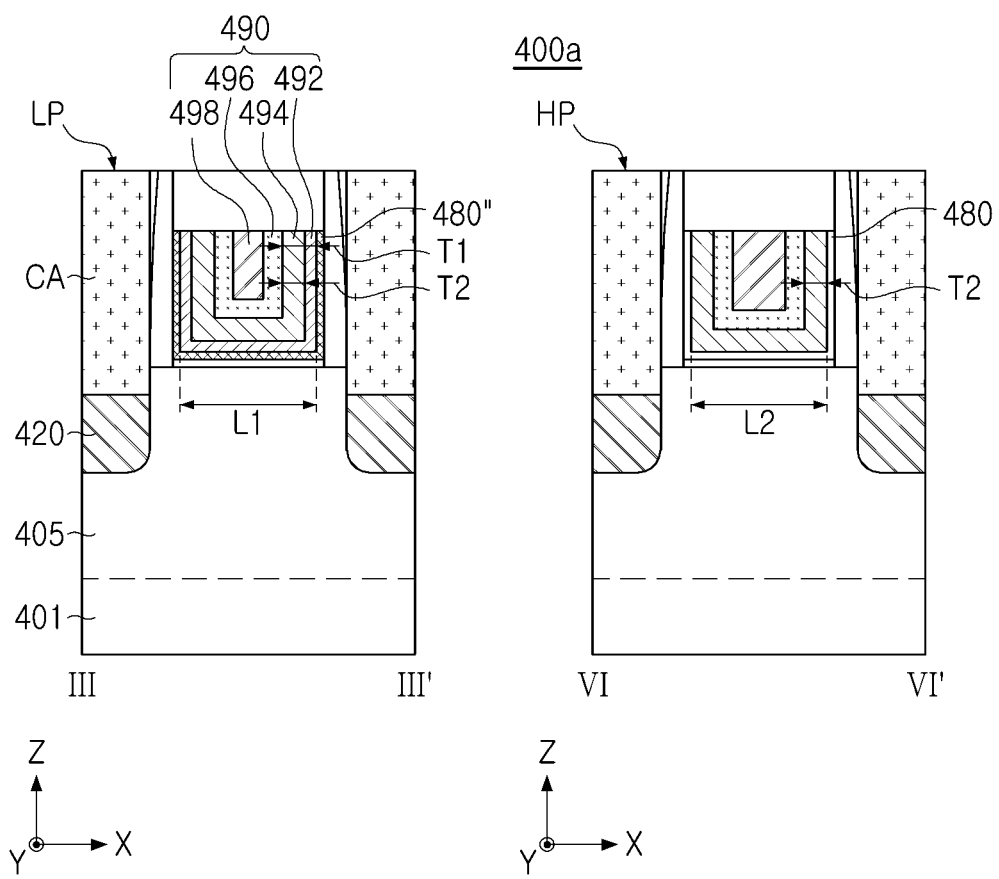
Figure 16B:
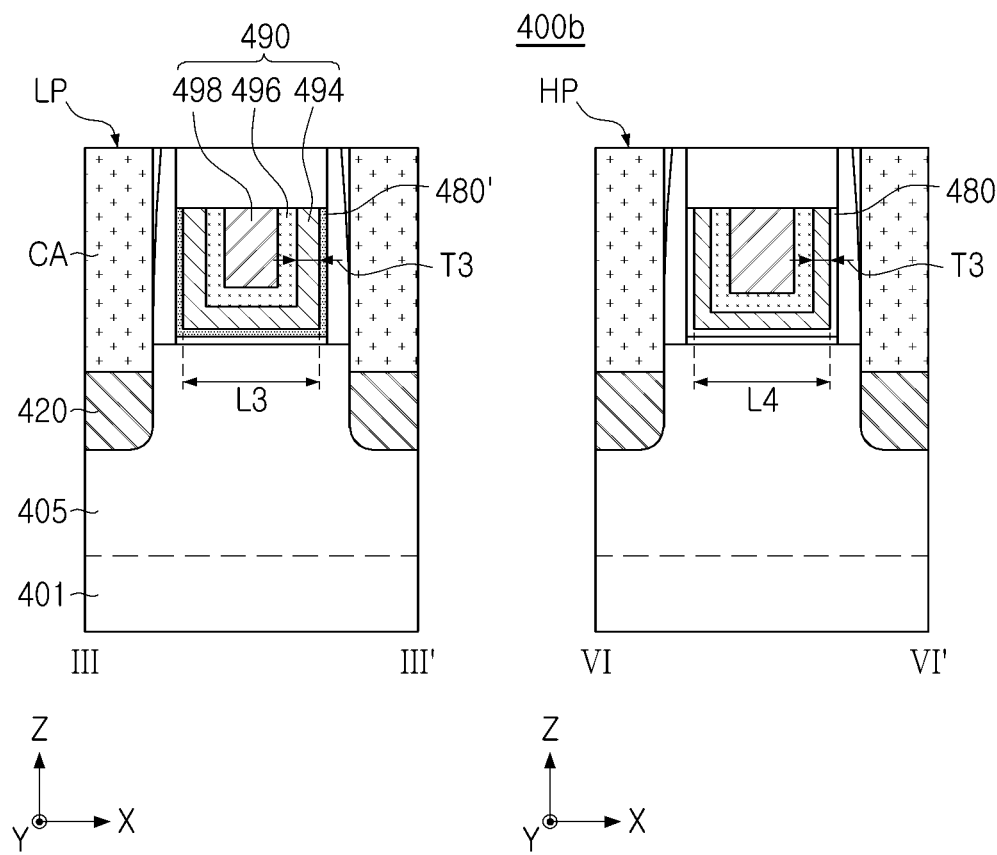

FIGS. 15, 16A and 16B are cross-sectional views of PMOS transistors depending on a threshold voltage, in semiconductor devices according to example embodiments.

FIGS. 15, 16A and 16B illustrate exemplary cross sections of the semiconductor device 2, illustrated in FIG. 11, taken along lines and VI-VI'. For ease of description, only main components of the semiconductor device 2 are illustrated in FIGS. 15, 16A and 16B.

Referring to FIGS. 12 and 15, a semiconductor device 400 according to an example embodiment may include FinFET elements, each being a transistor in which active fins 405 have a fin structure. The FinFET devices may include active fins 405, intersecting each other, and transistors disposed around gate electrode layers. As an example, all transistors illustrated in FIG. 15 may be PMOS transistor.

The semiconductor device 400 may include a plurality of first PMOS transistors, having a first threshold voltage, and a plurality of second PMOS transistors, having a second threshold voltage, higher than the first threshold voltage, depending on a location. The plurality of first PMOS transistors and the plurality of second PMOS transistors may have different types of gate structure, and thus, may have different threshold voltages.

For example, threshold voltages of a PMOS transistor may be classified into an ultra threshold voltage (hereinafter referred to as "U"), a superlow threshold voltage (hereinafter referred to as "S"), a low threshold voltage (hereinafter referred to as "L"), and a regular threshold voltage (hereinafter referred to as "R"), based on magnitudes thereof. A gate structure may have shapes different depending on respective magnitudes of threshold voltages. As an example, PMOS transistors illustrated in enlarged cross-sectional views of FIGS. 16A and 16B may have U, S, L, and R in the order named.

Referring to FIG. 16A, a semiconductor device 400a according to an example embodiment may include a plurality of first PMOS transistors LP, having a first threshold voltage, and a plurality of second PMOS transistors HP having a second threshold voltage, higher than the first threshold voltage. As an example, the first threshold voltage may correspond to U, and the second threshold voltage may correspond to S.

Referring to FIG. 16B, a semiconductor device 400b according to an example embodiment may include a plurality of first PMOS transistors LP, having a first threshold voltage, and a plurality of second PMOS transistors HP having a threshold voltage, higher than the first threshold voltage. As an example, the first threshold voltage may correspond to L, and the second threshold voltage may correspond to R.

However, a combination of the transistors, illustrated in FIGS. 16A and 16B, is only an example and the present disclosure is not limited thereto, and various combinations thereof may be made according to example embodiments. As an example, the plurality of first PMOS transistors LP and the plurality of second PMOS transistors HP may have threshold voltages, respectively corresponding to U and S, U and L, U and R, S and L, S and R, and L and R.

Gate structures, included in the semiconductor device 400a, may each include gate dielectric layers 480, 480', and 480" and a gate electrode layer 490. For example, the gate dielectric layers 480, 480', and 480" may be disposed between active fins 405 and gate electrode layer 490. A first gate dielectric layer 480 may be included in the plurality of second PMOS transistors HP of the semiconductor device 400a and the plurality of second PMOS transistors HP of the semiconductor device 400b, a second gate dielectric layer 480' may be included in the plurality of first PMOS transistors LP of the semiconductor device 400b, and a third gate dielectric layer 480" may be included in the plurality of first PMOS transistors LP of the semiconductor device 400a. The gate electrode layers 490, included in the semiconductor devices 400a and 400b, may include different conductive work function layers, respectively.

The first, second, and third gate dielectric layers 480, 480', and 480" may include different materials. As an example, the third gate dielectric layer 480" may be formed of the same dielectric material as the first gate dielectric layer 480, and may further include a first element doped or diffused in the dielectric material. For example, the first element may include any one or any combination of aluminum (Al), tantalum (Ta), tungsten (W), manganese (Mn), chromium (Cr), ruthenium (Ru), platinum (Pt), gallium (Ga), germanium (Ge), and gold (Au). The first element may be diffused from the gate electrode layer 490. As an example, when the first element is aluminum (Al), a concentration of aluminum (Al) in the third gate dielectric layer 480" may be lower than a concentration of aluminum (Al) in the aluminum oxide $Al_2O_3$. The first element may change an interface between the third gate dielectric layer 480" and the gate electrode layer 490 to decrease a threshold voltage of a transistor.

The second gate dielectric layer 480' may be formed of the same dielectric material as the first gate dielectric layer 480, and may further include a second element doped or diffused in the dielectric material. As an example, the second element may serves to increase a threshold voltage of a transistor. For example, the second element may include at least one rare earth element, among lanthanum (La), gadolinium (Gd), ruthenium (Lu), yttrium (Y), and scandium (Sc). The elements may form, for example, an electric dipole to increase a threshold voltage of a transistor. The second gate dielectric layer 480' may not include the first element, and the third gate dielectric layer 480" may not include the second element.

The first gate dielectric layer 480 may not include the first element and the second element. For example, the first gate dielectric layer 480 may be formed of a dielectric material including one of hafnium (Hf), titanium (Ti), zirconium (Zr), and praseodymium (Pr).

The gate electrode layer 490 may be disposed on the active fins 405 to extend in a Y direction while intersecting the active fins 405. Channel regions of transistors may be formed in the active fins 405 intersecting the gate electrode layer 490. The gate electrode layer may have a predetermined length in a channel direction, for example, an X direction. For example, channels of the transistors, illustrated in FIGS. 16A and 16B, may have first to fourth lengths L1, L2, L3, and L4, respectively. The first to fourth lengths L1, L2, L3, and L4 may be substantially the same or similar to each other. For example, the first to fourth lengths L1, L2, L3, and L4 may range from about 3 nm to about 50 nm.

In the plurality of first PMOS transistors LP included in the semiconductor device 400a, the gate electrode layer 490 may include a first conductive layer 492, a second conductive layer 494, a third conductive layer 496, and an upper conductive layer 498, stacked from the third gate dielectric layer 480" in the order named. A sum of thicknesses of the first conductive layer 492 and the second conductive layer 494 may be T1, and a thickness of the second conductive layer 494 may be T2.

In the plurality of second PMOS transistors HP included in the semiconductor device 400a, the gate electrode layer 490 may include a second conductive layer 494, a third conductive layer 496, and an upper conductive layer 498, stacked from the first gate dielectric layer 480 in the order named. A thickness of the second conductive layer 494 may be T2. In other words, the thickness of the second conductive layer 494, included in the plurality of second PMOS transistors HP, and the thickness of the second conductive layer 494, included in the plurality of first PMOS transistors LP, may be the same.

In the plurality of first PMOS transistors LP included in the semiconductor device 400b, the gate electrode layer 490 may include a second conductive layer 494, a third conductive layers 496, and an upper conductive layer 498, stacked from the second gate dielectric layer 480' in the order named. A thickness of the second conductive layer 494 may be T3 smaller than T2.

In the plurality of second PMOS transistors HP included in the semiconductor device 400b, the gate electrode layer 490 includes a second conductive layer 494, a third conductive layer 496, and an upper conductive layer 498, stacked from the first gate dielectric layer 480 in the order named. A thickness of the second conductive layer 494 may be T3. In other words, the thickness of the second conductive layer 494, included in the plurality of second PMOS transistors HP, and the thickness of the second conductive layer 494, included in the plurality of first PMOS transistors LP, may be the same.

However, a relative thickness of each of the layers, constituting the gate electrode layers 490, is only an example and is not limited to that illustrated in the drawings, and may be changed in various manners according to example embodiments.

The first conductive layer 492 may have a first work function and may be, for example, a layer including a metal element. The first conductive layer 492 may include a material having a smaller work function than each of the second conductive layer 494 and the fourth conductive layer 496, but the present disclosure is not limited thereto. The first conductive layer 492 may be a layer including the first element of the third gate dielectric layer 480", and may be a layer for providing the first element to the third gate dielectric layer 480".

For example, the first conductive layer 492 may include an alloy, a conductive metal carbide, a conductive metal nitride, each including aluminum (Al) as the first element, or combinations thereof, and may include titanium-aluminum (TiAl), titanium-aluminum carbide (TiAlC), titanium-aluminum nitride (TiAlN), or combinations thereof. Alternatively, the first conductive layer 492 may include an alloy, a conductive metal carbide, a conductive metal nitride, each including any one or any combination of tantalum (Ta), tungsten (W), manganese (Mn), chromium (Cr), ruthenium (Ru), platinum (Pt), gallium (Ga), germanium (Ge), and gold (Au) as the first element, rather than aluminum (Al), or combinations thereof.

The second conductive layer 494 may have a second work function greater than the first work function, and may include a metal element such as titanium nitride (TiN), tantalum nitride (TaN), tungsten (W), tungsten carbon nitride (WCN), or combinations thereof. The second conductive layer 494 may have a different thickness for each transistor.

The third conductive layer 496 may have a third work function smaller than the second work function and may include, for example, a metal element. For example, the third conductive layer 496 may include an alloy, a conductive metal carbide, a conductive metal nitride, each including aluminum (Al), combinations thereof, and may include titanium-aluminum (TiAl), titanium-aluminum carbide (TiAlC), titanium-aluminum nitride (TiAlN), or combinations thereof.

The upper conductive layer 498 may include a material different from a material included in the third conductive layer 496 and may include, for example, TiN, TaN, W, WCN, or combinations thereof. In the gate electrode layer 490, the upper conductive layer 498 may be disposed on the third conductive layer 496 and may completely fill a region between the third conductive layer 496 and a gate capping layer.

Figure 17:
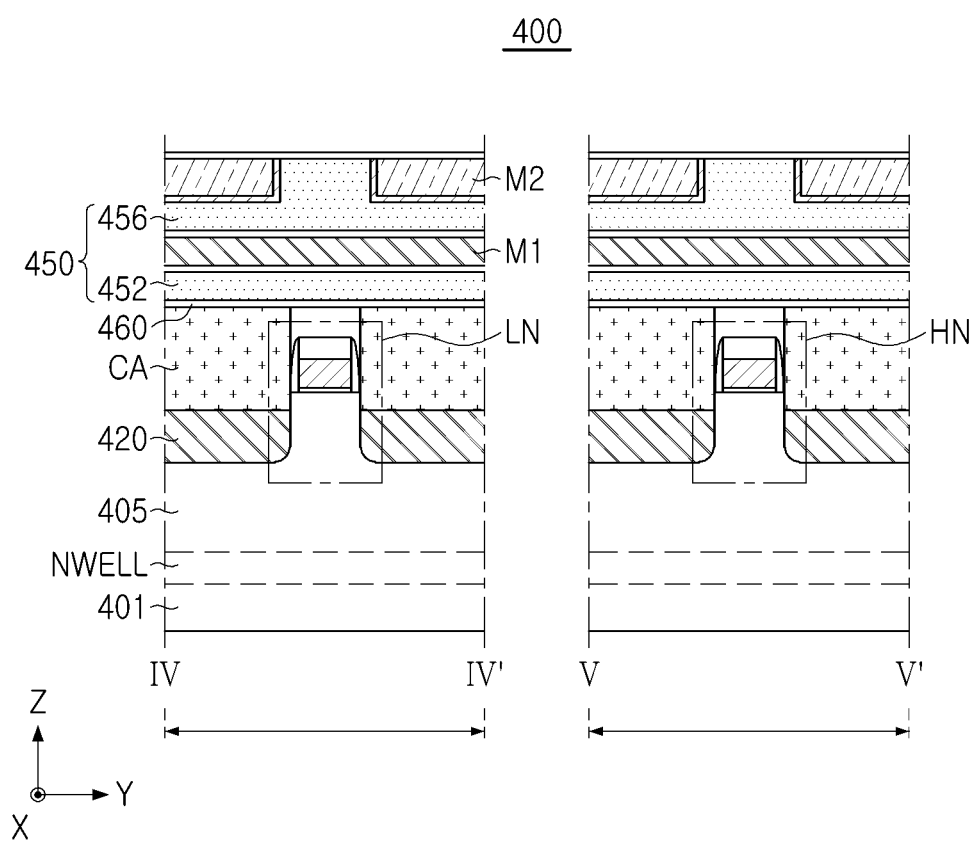
FIGS. 17, 18A and 18B are cross-sectional views of NMOS transistors depending on a threshold voltage, in a semiconductor device according to example embodiments.
Figure 18A:
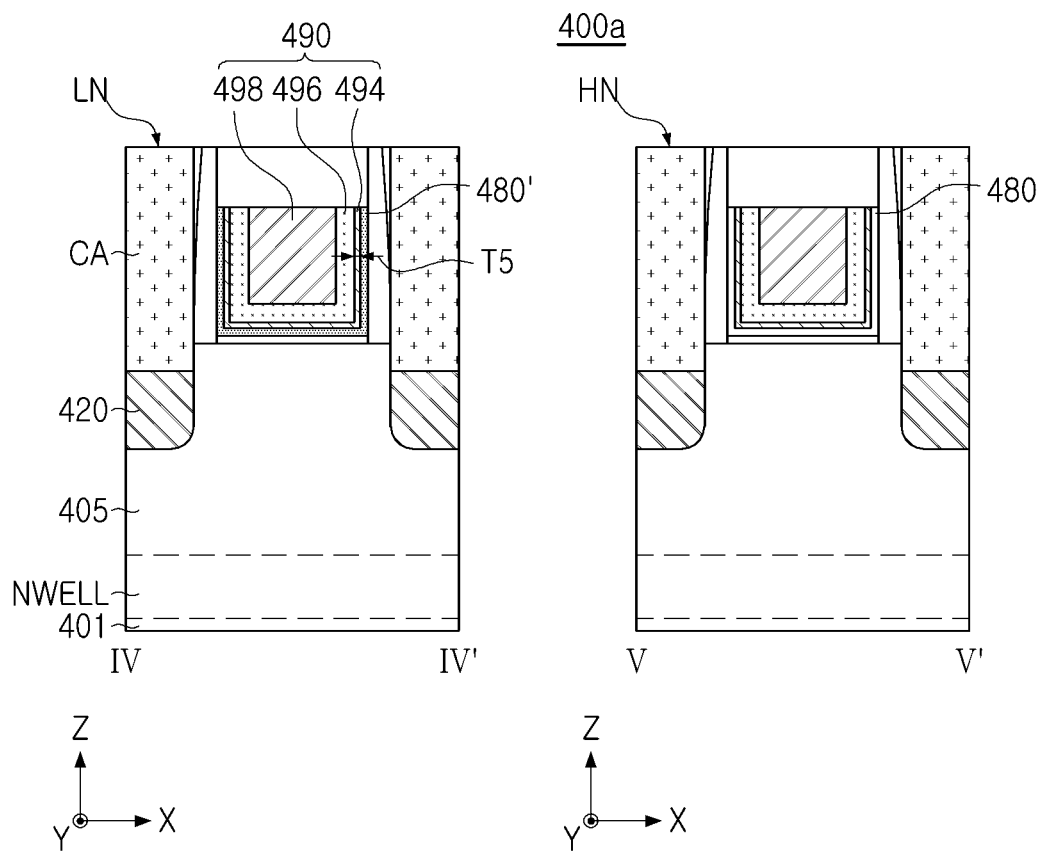
Figure 18B:
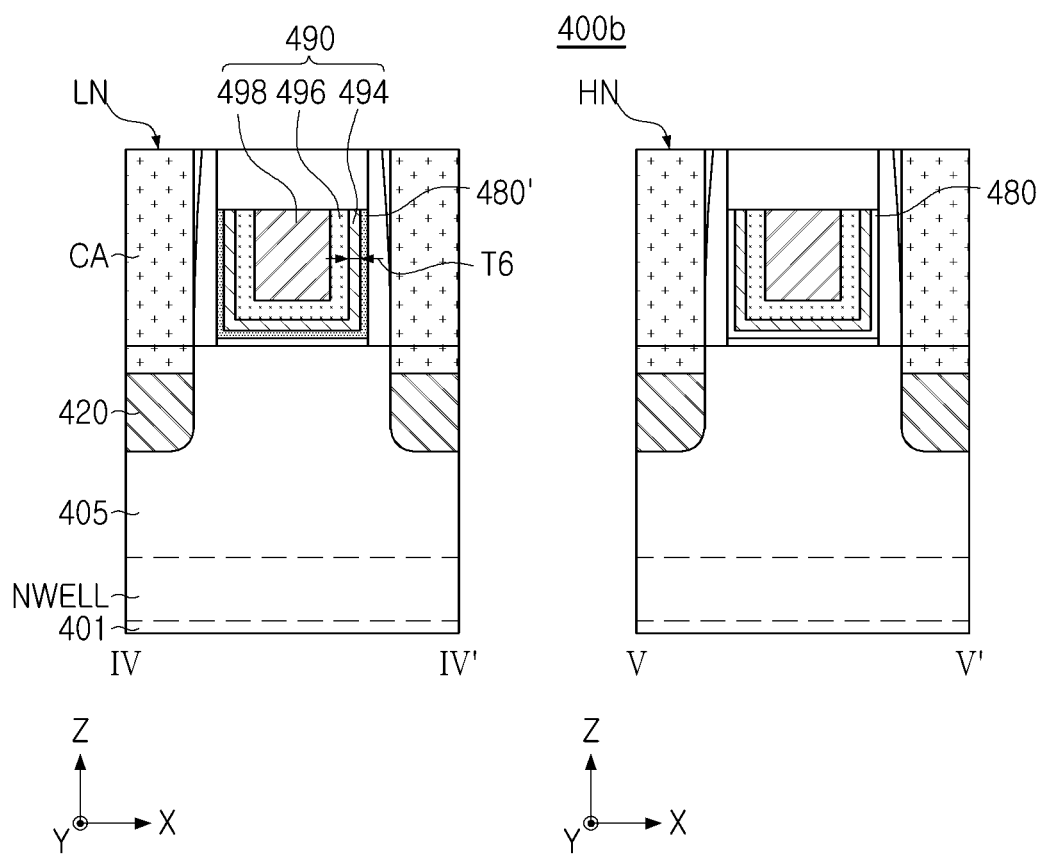

FIGS. 17, 18A and 18B are cross-sectional views of NMOS transistors depending on a threshold voltage, in a semiconductor device according to example embodiments.

FIGS. 17, 18A and 18B illustrate exemplary cross sections of the semiconductor device 2, illustrated in FIG. 11, taken along lines IV-IV' and V-V' of FIG. 1. For ease of description, only main components of the semiconductor device 2 are illustrated in FIGS. 17 and 18B.

Referring to FIGS. 12 and 17, a semiconductor device 400 according to an example embodiment may include active fins 405, intersecting each other, and transistors disposed around gate electrode layers. As an example, all transistors illustrated in FIG. 17 may be NMOS transistors.

Referring to FIG. 17, a semiconductor device 400 according to an example embodiment may include a plurality of first NMOS transistors LN, having a first threshold voltage, and a plurality of second NMOS transistors HN having a second threshold voltage, higher than the first threshold voltage.

Similarly to a PMOS transistor, threshold voltages of an NMOS transistor may be classified into an ultra threshold voltage (hereinafter referred to as "U"), a superlow threshold voltage (hereinafter referred to as "S"), a low threshold voltage (hereinafter referred to as "L"), and a regular threshold voltage (hereinafter referred to as "R"), based on magnitudes thereof. A gate structure may have shapes different depending on respective magnitudes of threshold voltages. In the present specification, magnitudes of threshold voltages may be compared as absolute values.

Referring to FIG. 18A, a semiconductor device 400a according to an example embodiment may include a plurality of first NMOS transistors LN, having a first threshold voltage, and a second threshold voltage, higher than the first threshold voltage. A plurality of second NMOS transistors HN may be included. As an example, the first threshold voltage may correspond to U, and the second threshold voltage may correspond to S.

Referring to FIG. 18B, a semiconductor device 400b according to an example embodiment may include a plurality of first NMOS transistors LN, having a first threshold voltage, and a plurality of second NMOS transistors HN having a second threshold voltage, higher than the first threshold voltage. As an example, the first threshold voltage may correspond to L, and the second threshold voltage may correspond to R.

However, a combination of the transistors, illustrated in FIGS. 18A and 18B, is only an example and the present disclosure is not limited thereto, and various combinations thereof may be made according to example embodiments. As an example, the plurality of first NMOS transistors LN and the plurality of second NMOS transistors HN may have threshold voltages, respectively correspond to U and S, U and L, U and R, S and L, S and R, and L and R. Hereinafter, the descriptions provided with reference to FIGS. 15 to 16B may be equally applied to descriptions provided with FIGS. 18A and 18B, and thus, repeated descriptions will be omitted.

Gate structures, included in the semiconductor device 400a, may include gate dielectric layers 480 and 480' and gate electrode layers 490, respectively. As an example, the gate dielectric layers 480 and 480' may be disposed between active fins 405 and a gate electrode layer 490. A first gate dielectric layer 480 may be included in the plurality of second NMOS transistors LN of the semiconductor device 400a and the plurality of second NMOS transistors LN of the semiconductor device 400b, and a second gate dielectric layer 480' may be included in the plurality of first NMOS transistors HN of the semiconductor device 400a and the plurality of first NMOS transistors HN of the semiconductor device 400b. The gate electrode layers 490, respectively included in the semiconductor devices 400a and 400b, may include different conductive work function layers.

In the plurality of first NMOS transistors LN included in the semiconductor device 400a, the gate electrode layer 490 may include a second conductive layer 494, a third conductive layer 496, and an upper conductive layer 498, stacked from the second gate dielectric layer 480' in the order named. A thickness of the second conductive layer 494 may be T5 smaller than T3.

In the plurality of second NMOS transistors HN included in the semiconductor device 400a, the gate electrode layer 490 may include a second conductive layer 494, a conductive layer 496, and an upper conductive layer 498, stacked from the first gate dielectric layer 480 in the order named. A thickness of the second conductive layer 494 may be T5. In other words, the thickness of the second conductive layer 494, included in the plurality of second NMOS transistors HN, and the thickness of the second conductive layer 494, included in the plurality of first NMOS transistors LN, may be the same.

In the plurality of first NMOS transistors LN included in the semiconductor device 400b, the gate electrode layer 490 may include a second conductive layer 494, a third conductive layer 496, and an upper conductive layer 498, stacked from the second gate dielectric layer 480' in the order named. A thickness of the second conductive layer 494 may be T4 smaller than T3.

In the plurality of second NMOS transistors HN included in the semiconductor device 400b, the gate electrode layer 490 may include a second conductive layer 494, a third conductive layer 496, and an upper conductive layer 498, stacked from the second gate dielectric layer 480' in the order named. A thickness of the second conductive layer 494 may be T4 smaller than T3.

However, a relative thickness of each of the layers, constituting the gate electrode layers 490, is only an example and is not limited to that illustrated in the drawings, and may be changed in various manners according to example embodiments.

Figure 19:
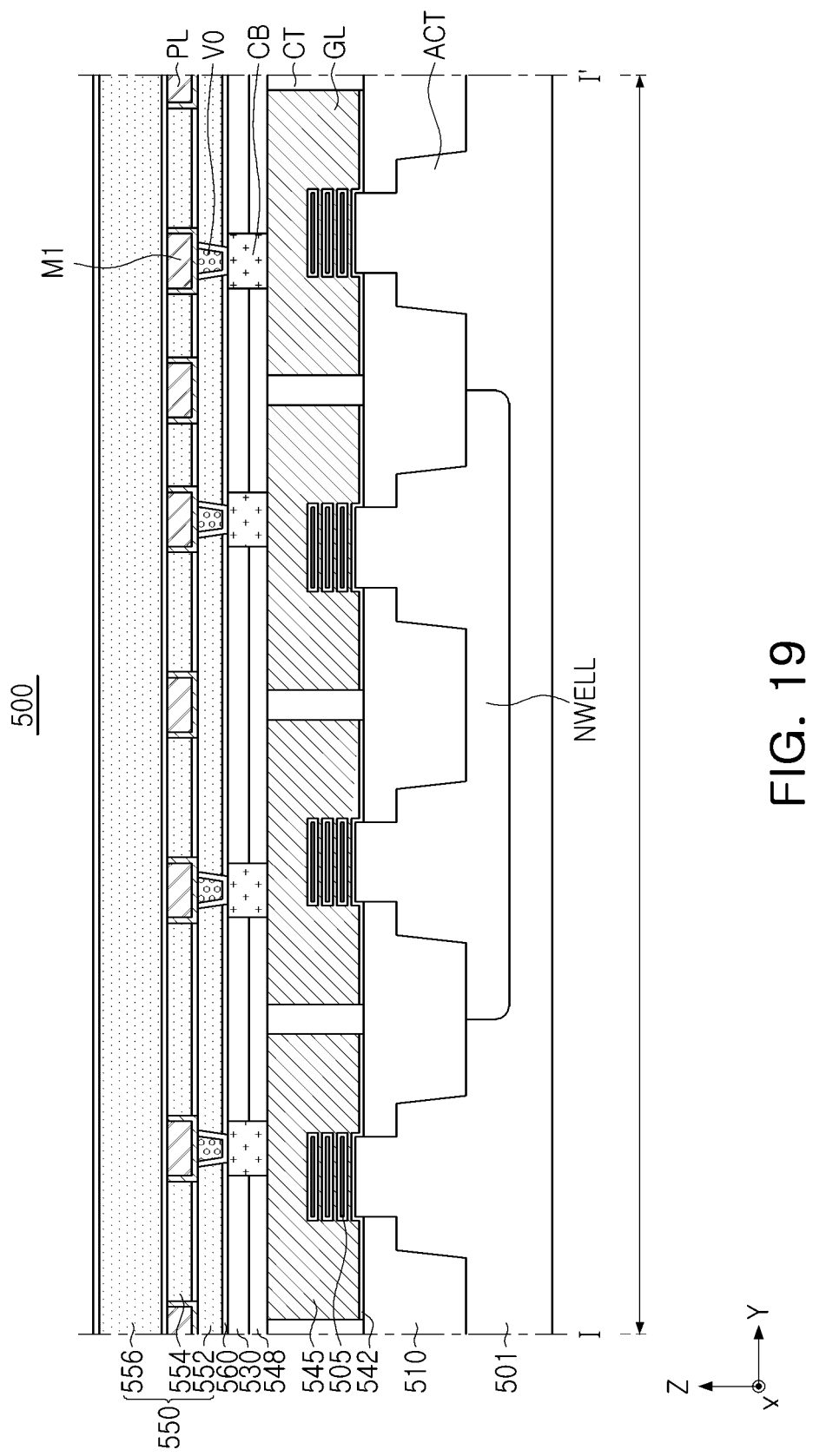
FIGS. 19 to 21 are cross-sectional views illustrating a semiconductor device according to an example embodiment.
Figure 20:
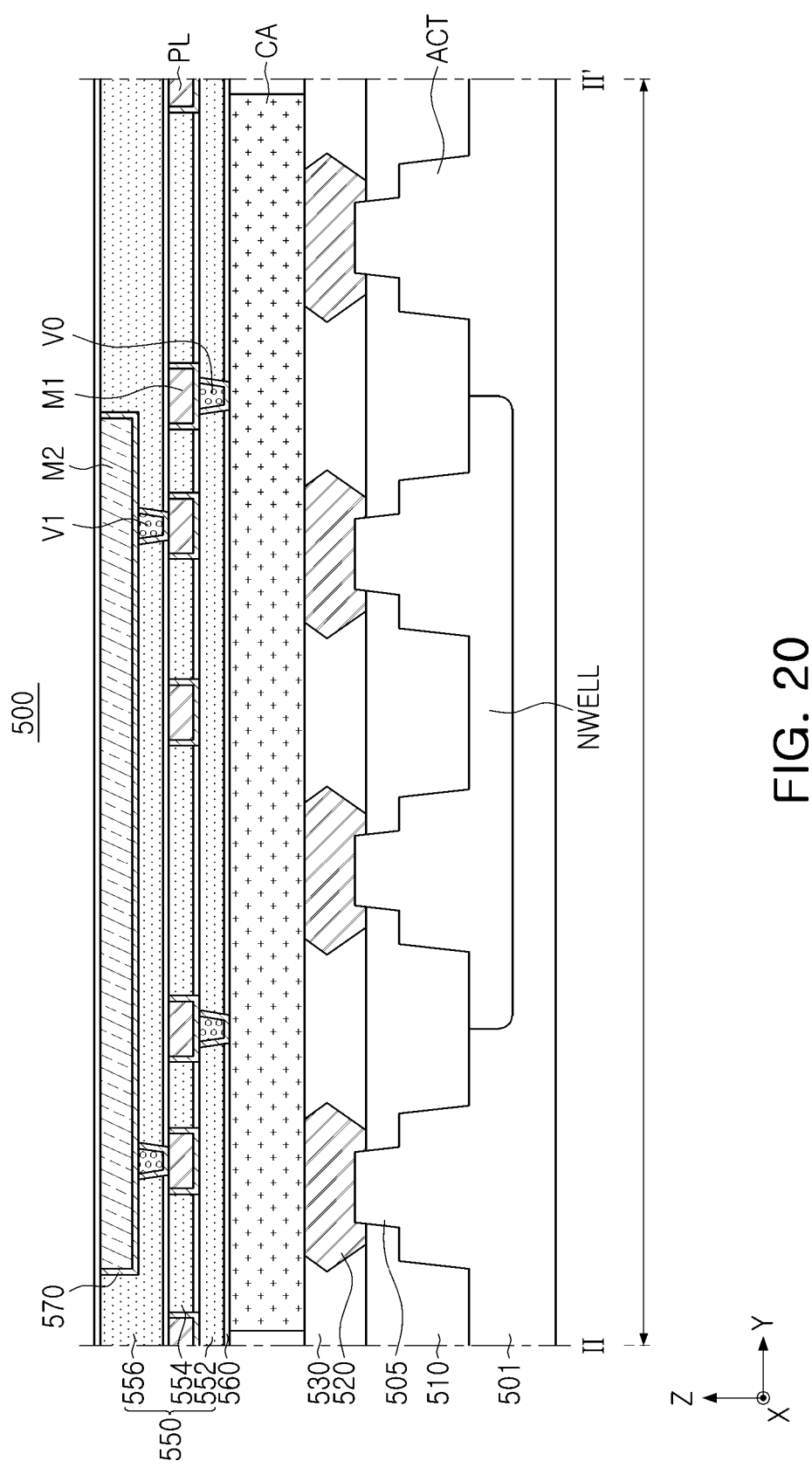
Figure 21:
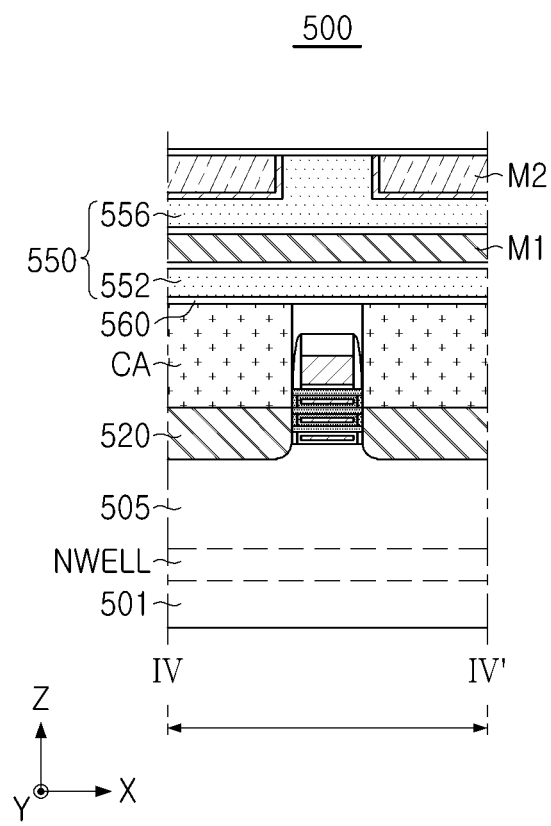

FIGS. 19 to 21 are cross-sectional views illustrating a semiconductor device according to an example embodiment.

FIGS. 19 to 21 illustrate regions, respectively corresponding to the semiconductor devices 400 illustrated in FIGS. 13, 14, and 17.

Referring to FIGS. 19 to 21, a semiconductor device 500 according to an example embodiment may further include a plurality of channel layers, disposed on the active regions ACT to be spaced apart from each other in a vertical direction, and internal spacer layers disposed to be parallel to gate electrode layers 545 between the plurality of channel layers. The semiconductor device 500 may have a gate-all-around structure in which a gate structure GL is disposed between active fins 505 and channel layers and between a plurality of nanosheet-shaped channel layers. For example, the semiconductor device 500 may include transistors having a multi-bridge channel FET (MBCFET) structure formed by channel layers, source/drain regions 520, and transistors.

The gate structure GL may be disposed on the active fins 405 and the plurality of channel layers to extend while intersecting the active fins 505 and the plurality of channel layers. Channel regions of transistors may be formed in the active fins 505 and the plurality of channel layers intersecting the gate structure GL. In the present example, the gate insulating layer 542 may be disposed between the active fins 505 and the gate electrode layer 545 as well as between the plurality of channel layers and the gate electrode layer 545. The gate electrode layer 545 may be disposed on the active fins 505 to extend upwardly of the plurality of channel layers while filling a space between the plurality of channel layers. The gate electrode layer 545 may be spaced apart from the plurality of channel layers by the gate insulating layer 542.

The internal spacer layers may be disposed to be parallel to the gate electrode layer 545 between the plurality of channel layers. The gate electrode layer 545 may be spaced apart from the source/drain regions 520 by the internal spacer layers to be electrically separated from each other. Each of the internal spacer layers may have a planar side surface facing the gate electrode layer 545, or may have a shape convexly rounded inwardly of the gate electrode layer 545. Each of the internal spacer layers may be formed of an oxide, a nitride, and an oxynitride. In particular, each of the internal spacer layers may be formed of a low-k dielectric material.

The plurality of channel layers may be disposed on the active region ACT as two or more nanosheets spaced apart from each other in a direction, perpendicular to upper surfaces of the active fins 505 on the active region ACT, for example, in a Z direction. The channel layers may be connected to the source/drain regions 520 and spaced apart from the upper surfaces of the active fins 505. The channel layers may have the same (or a similar) width as the active fins 505 in the Y direction, and may have the same (or a similar) width as the gate structure in the X direction. However, according to example embodiments, the channel layers may have decreased widths such that side surfaces of the channel layers are disposed below the gate structure in the X direction.

The plurality of channel layers may be formed of a semiconductor material and may include any one or any combination of, for example, silicon (Si), silicon-germanium (SiGe), and germanium (Ge). The channel layers 115 may be formed of, for example, the same material as a substrate 501. The number and shapes of the channel layers, constituting a single channel structure, may be changed in various manners according to example embodiments. For example, according to example embodiments, a channel layer may further disposed in a region in which the active fins 505 are in contact with a gate electrode layer.

Figure 22:
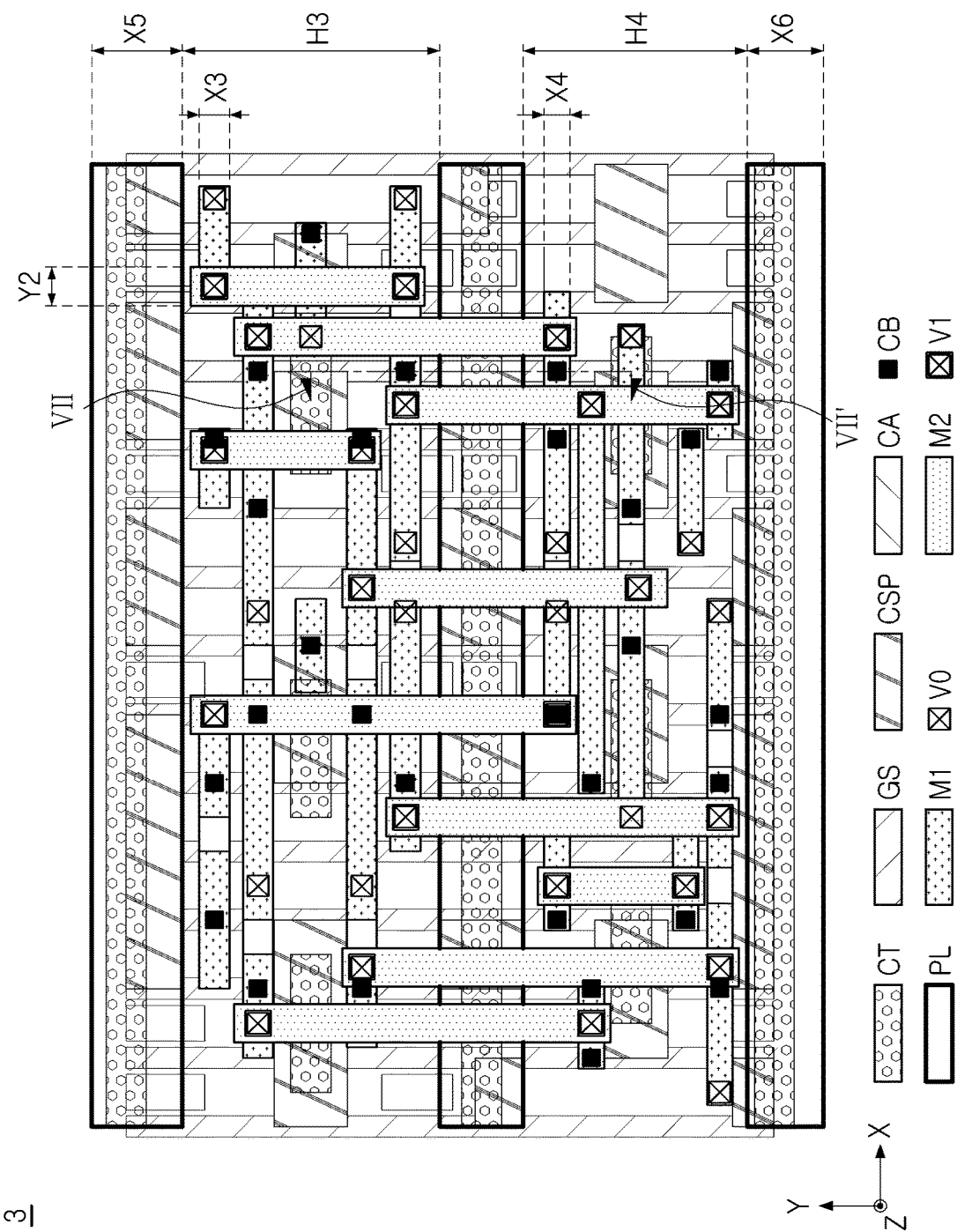
FIG. 22 is a layout diagram when distances between regions are different from each other, in a semiconductor device according to an example embodiment.
Figure 23:
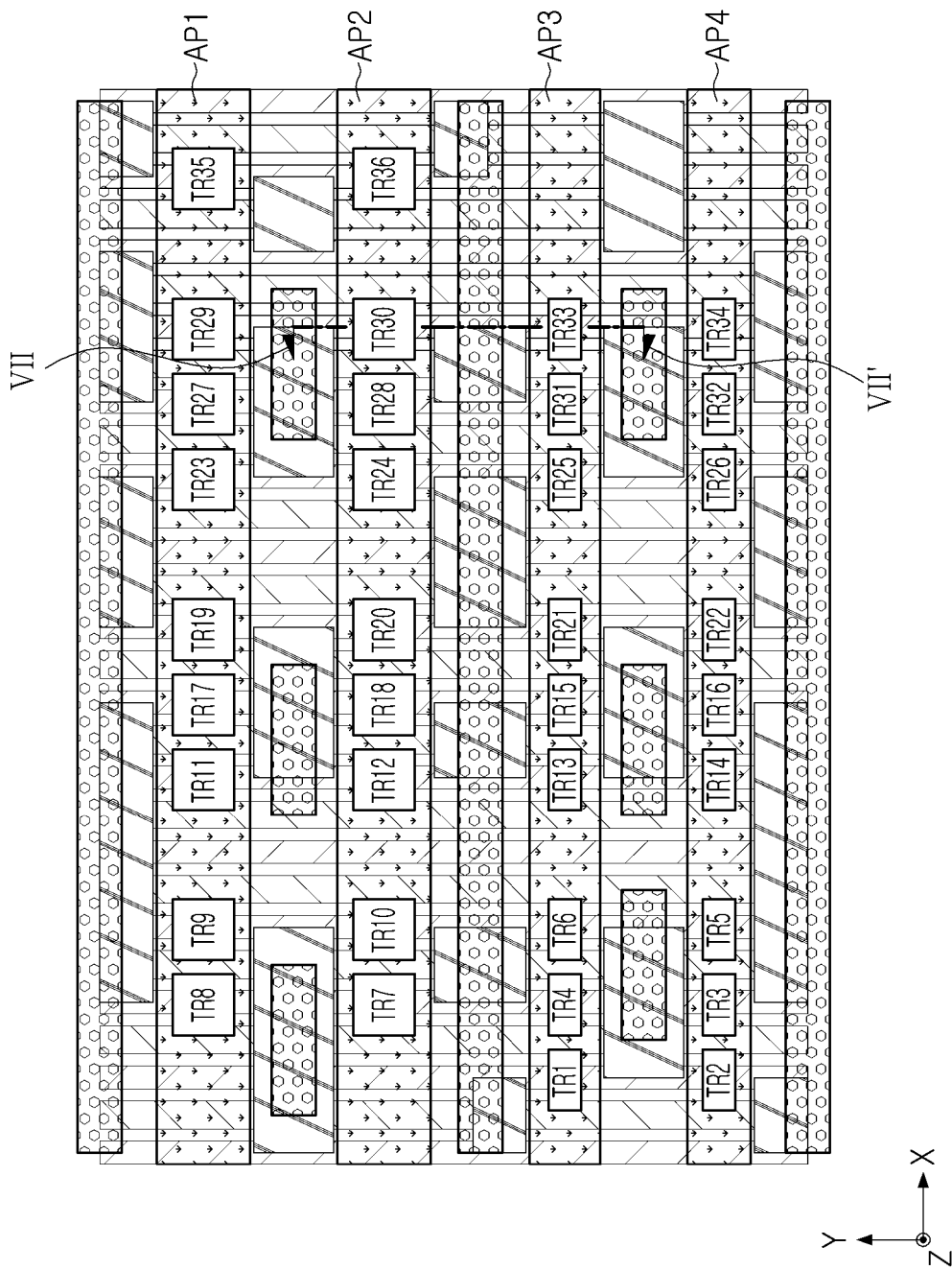
FIG. 23 is a view illustrating placement of transistors included in the semiconductor device of FIG. 22.

FIG. 22 is a layout diagram when distances between regions are different from each other, in a semiconductor device according to an example embodiment. FIG. 23 is a view illustrating placement of transistors included in the semiconductor device of FIG. 22.

Referring to FIGS. 22 and 23, a semiconductor device 3 according to an example embodiment may include the same (or similar) components as the semiconductor device 2 illustrated in FIGS. 10 and 11.

In the semiconductor device 3 according to an example embodiment, a length H3 of a first region may be greater than a length H4 of a second region in a Y direction intersecting power supply lines. Therefore, lengths of a first active region AP1 and a second active region AP2, included in the first region, in the Y direction may be greater than lengths of a third active region AP3 and a fourth active region AP4, included in the second region.

Due to a structure of the semiconductor device 3, a thickness X3 of first interconnection lines M1, included in the first region, may be greater than the thickness X1 of the first interconnection lines M1 included in the first region of the semiconductor device 2 illustrated in FIG. 10. As an example, the thickness X3 of the first interconnection lines M1, included in the first region of the semiconductor device 3, may be greater than a thickness X4 of first interconnection lines M1 included in the second region of the semiconductor device 3. Accordingly, performance of the semiconductor device 3 may be improved as resistance of the first interconnection lines M1 included in the first region is decreased. A thickness Y2 of second interconnection lines M2, included in the semiconductor device, may be the same as or similar to a thickness Y1 of the second interconnection lines M2 included in the semiconductor device 2 illustrated in FIG. 10. However, this is only an example, and various designs thereof may be made according to example embodiments. As an example, when an interconnection line has a great thickness, performance of the semiconductor device 3 may be improved by decreasing resistance. When an interconnection has a small thickness, the number of interconnection lines, able to be integrated in the semiconductor device 3, may be increased to improve the degree of freedom of a layout. Accordingly, a shape of the interconnection lines of the semiconductor device 3 is not limited to that illustrated in FIG. 22, and may be designed in various manners, as necessary.

Due to the structure of the semiconductor device 3, a thickness X5 of a power supply line PL, included in the first region, may be different from a thickness X6 of a power supply line PL included in the second region. As an example, because a length H3 of the first region in the Y direction is greater than a length H4 of the second region in the y direction, the thickness X5 of the power supply line PL, included in the first region, may be greater than the thickness X6 of the power supply line included in the second region. In the case of the first region, a thick power supply line PL may be used to increase the magnitude of power able to be supplied. In the case of the second region, a thin power supply line may be used to integrate the semiconductor device 3 and to have an advantage in terms of a layout area. However, this is not limited to what is illustrated in FIG. 22, and the thicknesses X5 and X6 of the power supply lines PL may be designed to be different from each other, as necessary.

Figure 24:
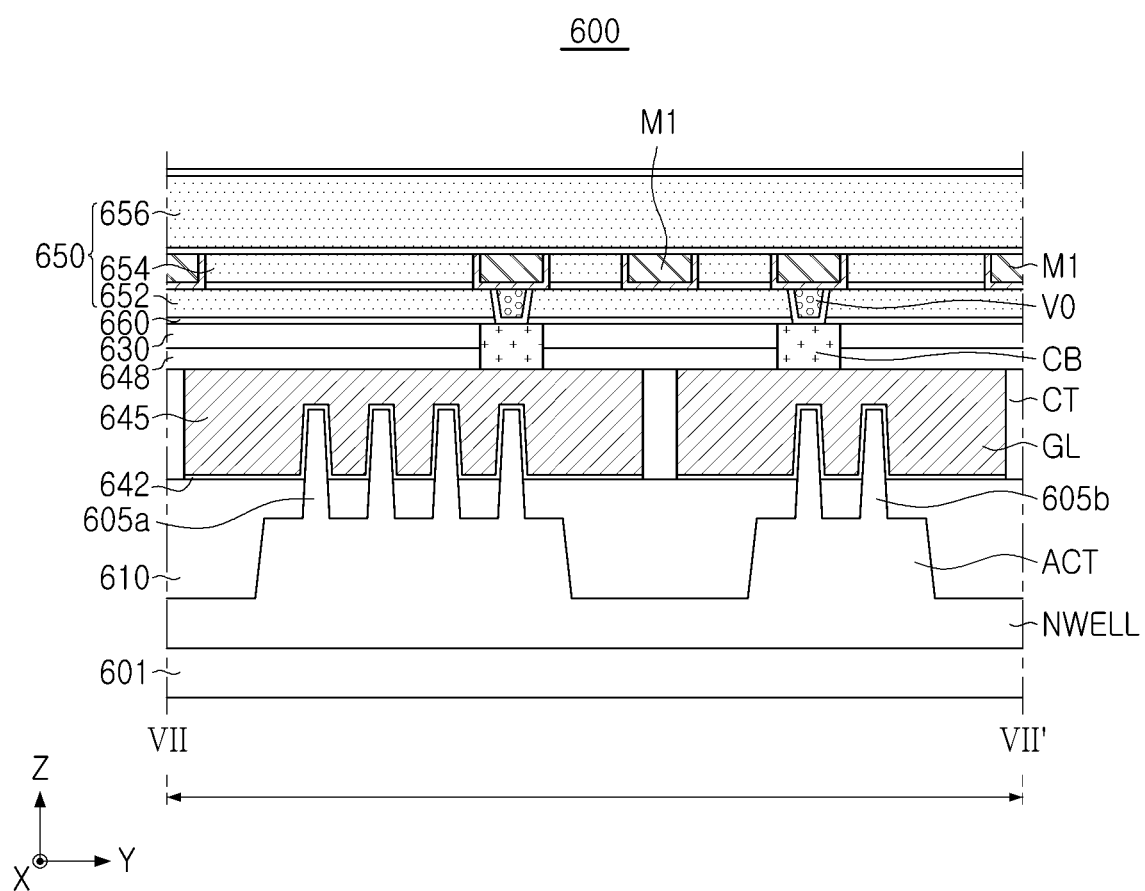
FIGS. 24 and 25 are cross-sectional views illustrating the semiconductor device of FIG. 22.
Figure 25:
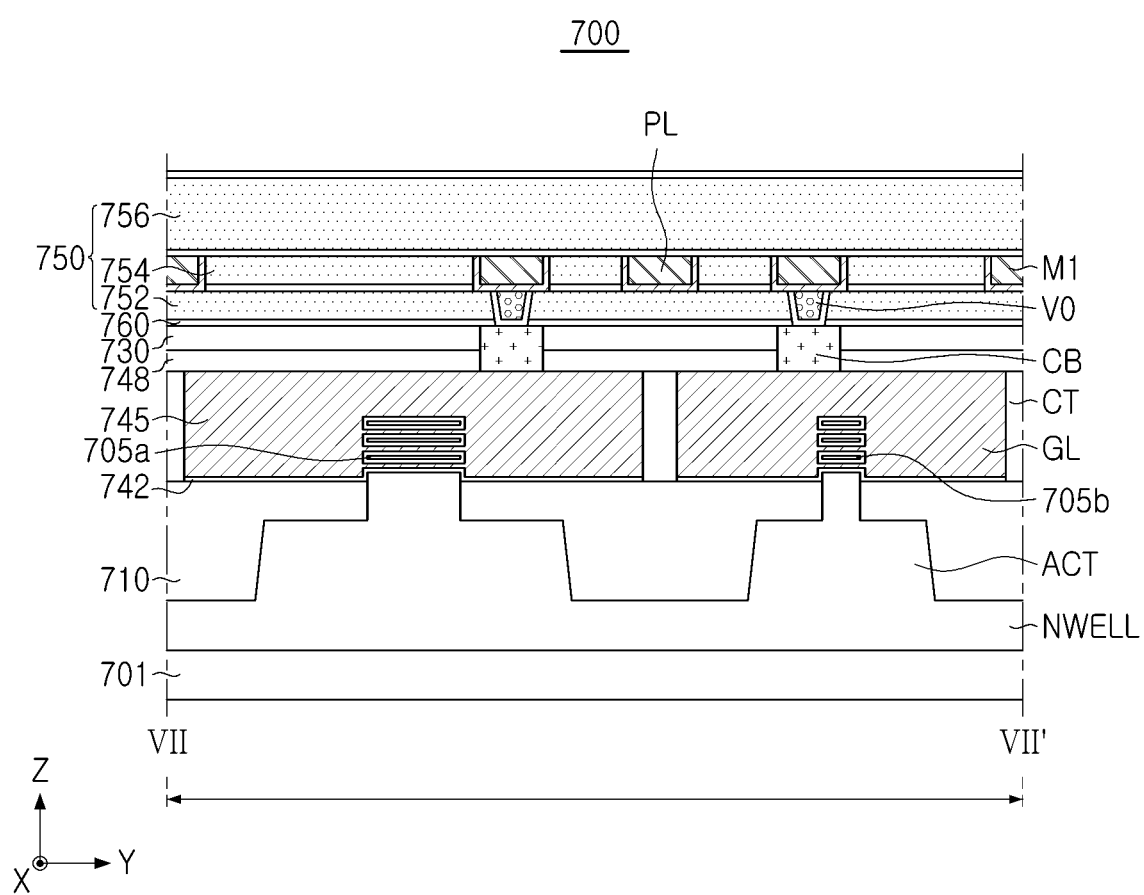

FIGS. 24 and 25 are cross-sectional views illustrating the semiconductor device of FIG. 22.

FIGS. 24 and 25 illustrate cross sections of the semiconductor device 3, illustrated in FIG. 22, taken along line VII-VII'. For ease of description, only main components of the semiconductor device 3 are illustrated in FIGS. 24 and 25.

Referring to FIG. 24, components of the semiconductor device 3, illustrated in a semiconductor device 600 according to an example embodiment, may be the same or similar to a portion of the semiconductor device 400 illustrated in FIG. 13. As an example, the semiconductor device 600 may be a semiconductor device 600 including transistors having a FinFET structure providing an active region using a fin structure.

Active fins 605a and 605b and an active region ACT, included in the semiconductor device 600, may be different from those of the semiconductor device 400. For example, as a length of the active region, in a Y direction, in the first region of the semiconductor device 3 illustrated in FIG. 22 is increased, the number of active fins 605a may be increased. As a length of the active region, in the Y direction, in the second region is decreased, the number of active fins 605b may be decreased. The increased number of the active fins 605a is illustrated as being four and the decreased number of the active fins 605b is illustrated as being two, but the increased number and the decreased number may not be limited thereto. As an example, the number of the active fins 605a and the number of the active fins 605b may each be 1 to 4, or 5 or more.

Referring to FIG. 25, components of the semiconductor device 3, illustrated in a semiconductor device 700 according to an example embodiment, may be the same or similar to a portion of the semiconductor device 500 illustrated in FIG. 19. As an example, the semiconductor device 700 may be a semiconductor device 700 including transistors having an MBCFET providing an active region using a nanosheet.

A nanosheet-shaped channel layer and an active region ACT, included in the semiconductor device 700, may be different from those of the semiconductor device 500. As an example, as a length of an active region, in a Y direction, in the first region of the semiconductor device 3 illustrated in FIG. 22, is increased, a length of channel layers in the Y direction may be increased. As a length of an active region, in the Y direction, in the second region is decreased, a length of channel layers in the Y direction may be decreased. The lengths of the channel layers in the Y direction are not limited those illustrated, and may be changed in various manners according to example embodiments.

Figure 26:
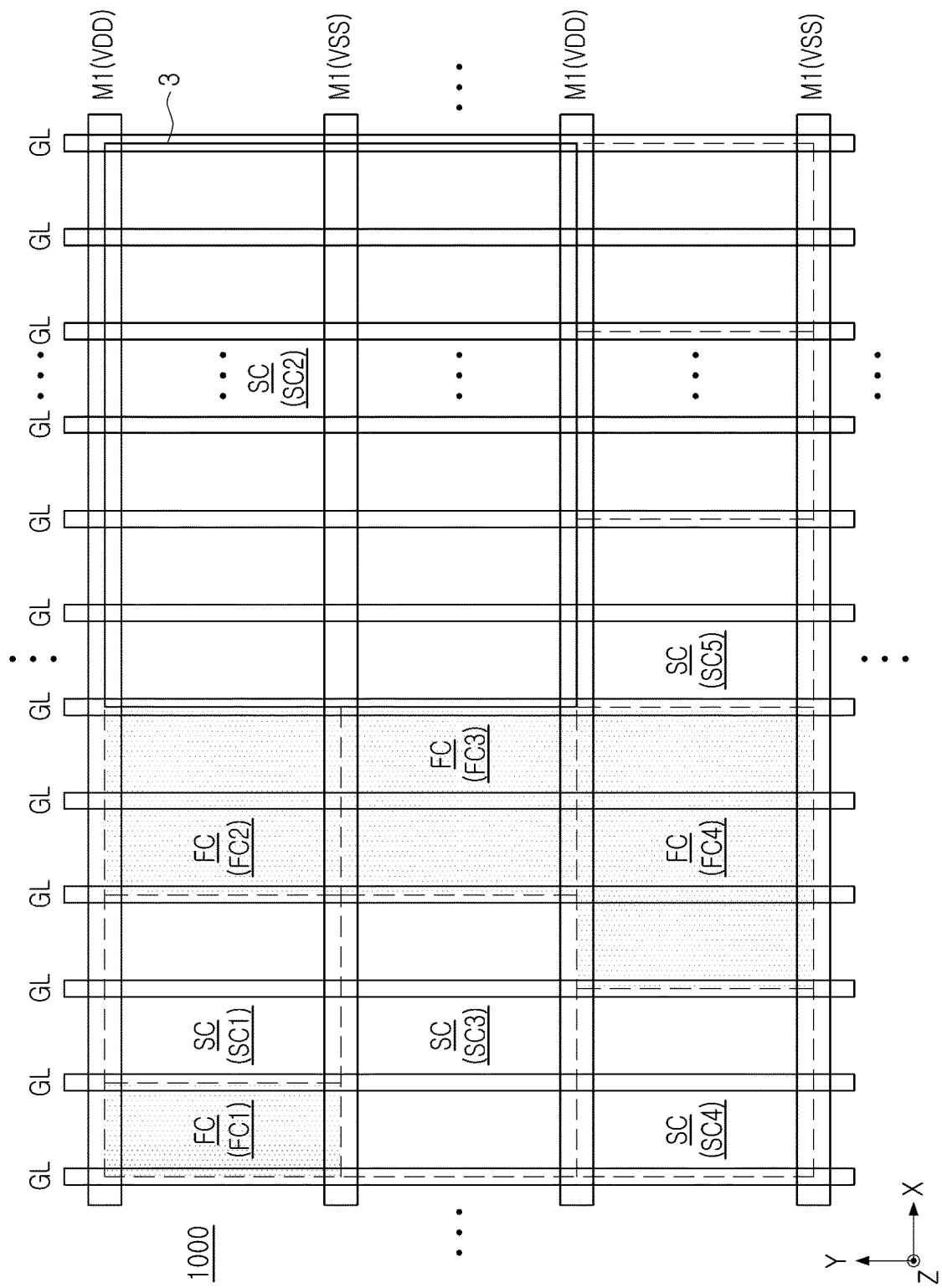
FIG. 26 is a schematic plan view of a semiconductor device according to an example embodiment.

FIG. 26 is a schematic plan view of a semiconductor device according to an example embodiment.

Referring to FIG. 26, a semiconductor device 3 according to an example embodiment may be included in various types of integrated circuit (IC) 1000 in the form of a cell. As an example, the integrated circuit 1000 may be defined as a plurality of cells, and the plurality of cells may be designed using a cell library including characteristic information of each of the cells. As an example, cell names, dimensions, gate widths, pins, delay characteristics, leakage current, critical voltages, and the like, may be defined in the cell library.

The semiconductor device 3 may be a single standard cell, and the cell library may be a standard cell library. As an example, a large-scale integrated circuit 1000 may be designed by variously combining cells, each including a semiconductor device 3 prepared in advance, as necessary.

The integrated circuit 1000 may include standard cell regions SC and filler cell regions FC. In the standard cell regions SC, first to fifth standard cells SC1 to SC5 may be disposed to implement circuits. In the filler cell regions FC, first to fifth filler cells FC1 to FC5 may be disposed to form a dummy region. The shapes, arrangements, and numbers of the first to fifth standard cells SC1 to SC5 and the first to fifth filler cells FC1 to FC5, illustrated in FIG. 26, are examples, and may be changed in various manners according to example embodiments.

The integrated circuit 1000 may include a plurality of gate lines GL and a plurality of power supply lines M1. The plurality of power supply lines M1 may include a power rail and may extend in a first direction, for example, an X direction. The plurality of power supply lines M1 may include high-power transmission lines M1(VDD), supplying a first voltage, and low-power transmission lines M1(VSS) supplying a second voltage lower than the first voltage. The high-power transmission lines M1(VDD) and the low-power transmission lines M1(VSS) may be spaced apart from each other to be alternately arranged in a second direction, intersecting the first direction, for example, a Y direction. As an example, the plurality of power supply lines M1 may extend along boundaries between the standard cell regions SC and the filler cell regions FC. However, this is only an example and the present disclosure is not limited thereto, and at least one of the plurality of power supply lines M1 may be disposed to intersect at least one of the standard cell regions SC and the filler cell regions FC.

The semiconductor device 3 may be included in the integrated circuit 1000 in the form of a standard cell. As an example, the semiconductor device 3 may be included in the second standard cell SC2. Accordingly, the second standard cell SC2 may be designed with a boundary of three power supply lines and a plurality of gate lines GL required to design the semiconductor device 3.

As described above, in a semiconductor device according to an example embodiment, transistors having different threshold voltages may be disposed in regions divided in terms of layout to reduce power consumption while maintaining operating speed. Thus, power consumption of the semiconductor device may be reduced. In addition, the regions divided in terms of layout may have different structures, so that performance of the semiconductor device may be improved while increasing a degree of integration of the semiconductor device.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a plurality of power supply lines extending in a first direction;
   a plurality of first transistors, each of which is formed in a first region and has a first threshold voltage; and
   a plurality of second transistors, each of which is formed in a second region and has a second threshold voltage that is higher than the first threshold voltage,
   wherein one of the plurality of power supply lines is interposed between the first region and the second region,
   the plurality of first transistors implement a first portion of a multiplexer circuit, a clock buffer and a first latch circuit that are disposed on a data path,
   the plurality of second transistors implement a second portion of the multiplexer circuit and a second latch circuit that are disposed on a feedback path, and the first portion of the multiplexer circuit and the second portion of the multiplexer circuit are disposed in a common location along the first direction.

2. The semiconductor device of claim 1, wherein the first portion of the multiplexer circuit receives a data signal as an input signal, and
the second portion of the multiplexer circuit receives a scan input signal as an input signal.

3. The semiconductor device of claim 1, wherein the first latch circuit comprises a first master latch circuit and a first slave latch circuit,
the second latch circuit comprises a second master latch circuit and a second slave latch circuit, and
the clock buffer is interposed between the first master latch circuit and the first slave latch circuit.

4. The semiconductor device of claim 1, wherein the plurality of first transistors comprise a plurality of first PMOS transistors and a plurality of first NMOS transistors,
the plurality of second transistors comprise a plurality of second PMOS transistors and a plurality of second NMOS transistors,
each of the plurality of first PMOS transistors comprises a first gate dielectric layer and a first work function metal layer stacked on the first gate dielectric layer,
each of the plurality of first NMOS transistors comprises a second gate dielectric layer and a second work function metal layer stacked on the second gate dielectric layer,
each of the plurality of second NMOS transistors comprises a third gate dielectric layer and a third work function metal layer stacked on the third gate dielectric layer, and
each of the plurality of second PMOS transistors comprises a fourth gate dielectric layer and a fourth work function metal layer stacked on the fourth gate dielectric layer.

5. The semiconductor device of claim 4, wherein the first gate dielectric layer comprises a material of the fourth gate dielectric layer and a first element different from the material of the fourth gate dielectric layer, and
the second gate dielectric layer comprises a material of the third gate dielectric layer and a second element different from the material of the third gate dielectric layer.

6. The semiconductor device of claim 4, wherein the fourth gate dielectric layer comprises a material of the fourth gate dielectric layer and a fourth element different from the material of the fourth gate dielectric layer, and
the third gate dielectric layer comprises a material of the second gate dielectric layer and a third element different from the material of the second gate dielectric layer.

7. The semiconductor device of claim 4, wherein the first work function metal layer has a first thickness and the fourth work function metal layer has a fourth thickness smaller than the first thickness,
the first work function metal layer and the fourth work function layer comprise a common material,
the second work function metal layer has a second thickness and the third work function metal layer has a third thickness greater than the second thickness, and
the second work function metal layer and the third work function layer comprise a common material.

8. The semiconductor device of claim 4, wherein the first work function metal layer further comprises a metal layer having a material that is not provided in the fourth work function metal layer.

9. The semiconductor device of claim 1, wherein in a second direction perpendicular to the first direction, a length of the first region is greater than a length of the second region.

10. A semiconductor device comprising:
a scan circuit comprising a first circuit and a second circuit, wherein the first circuit is configured to receive a data signal and the second circuit is configured to receive a scan input signal; and
a latch circuit comprising a third circuit and a fourth circuit, wherein the third circuit is disposed on a data path and the fourth circuit is disposed on a feedback path,
wherein a plurality of first transistors having a first threshold voltage implement the first circuit and the third circuit,
a plurality of second transistors having a second threshold voltage implement the second circuit and the fourth circuit, the second threshold voltage being higher than the first threshold voltage,
a power supply line extending in a first direction is interposed between the plurality of first transistors and the plurality of second transistors,
a first dummy region is disposed on one side of the first circuit in the first direction, and a second dummy region is disposed on another side of the first circuit in the first direction, and
the first circuit and the second circuit have a first common node defined by a first active contact intersecting the power supply line in a second direction, perpendicular to the first direction.

11. The semiconductor device of claim 10, wherein the scan circuit comprises a multiplexer, and
the first common node is an output node of the multiplexer.

12. The semiconductor device of claim 10, wherein the third circuit and the fourth circuit have a second common node and a third common node,
the second common node is defined by a second active contact extending in a second direction, perpendicular to the first direction, and
the third common node is defined by a third active contact extending in the second direction.

13. The semiconductor device of claim 12, comprising:
a first dummy gate line interposed between the first active contact and the second active contact;
a second dummy gate line interposed between the second active contact and the third active contact; and
a third dummy gate line disposed on one side of the third active contact,
wherein each of the first dummy gate line, the second dummy gate line, and the third dummy gate line extend in the second direction.

14. The semiconductor device of claim 10, further comprising:
a scan enable inverter circuit that shares a common location with the first dummy region along the first direction, the scan enable inverter circuit being formed by the plurality of second transistors; and
an output inverter circuit that shares a location with the second dummy region along the first direction, the output inverter circuit being formed by the plurality of first transistors.

15. A semiconductor device comprising:
a first power supply line, a second power supply line, and a third power supply line, extending along a first direction;

a plurality of first transistors having a first characteristic and being disposed in a first region between the first power supply line and the second power supply line; and a plurality of second transistors having a second characteristic, different from the first characteristic, and being disposed in a second region between the second power supply line and the third power supply line, wherein a distance between the first power supply line and the second power supply line is greater than a distance between the second power supply line and the third power supply line, and the first characteristic and the second characteristic comprise any one or any combination of a transistor threshold voltage, a distance between gates, and a cell height.

16. The semiconductor device of claim 15, wherein each of the plurality of first transistors and the plurality of second transistors comprises at least one fin structure providing an active region, the first characteristic and the second characteristic indicate a number of fins in the at least one fin structure, and the number of fins indicated by the first characteristic is greater than the number of fins indicated by the second characteristic.

17. The semiconductor device of claim 15, wherein each of the plurality of first transistors and the plurality of second transistors comprise at least one nanosheet providing an active region, the first characteristic and the second characteristic indicate a length of the at least one nanosheet in a second direction intersecting the first direction, and the length indicated by the first characteristic is greater than the length indicated by the second characteristic.

18. The semiconductor device of claim 15, wherein a thickness of metal interconnections provided in the first region that extend in the first direction is greater than a thickness of metal interconnections provided in the second region that extend in the first direction.

19. The semiconductor device of claim 15, wherein a first active region and a second active region extend in the first direction within the first region, a third active region and a fourth active region extend in the first direction within the second region, and the first power supply line, the first active region, the second active region, the second power supply line, the third active region, the fourth active region, and the third power supply line are sequentially provided along a second direction intersecting the first direction.

20. The semiconductor device of claim 19, wherein the plurality of first transistors comprise a plurality of first PMOS transistors and a plurality of first NMOS transistors, the plurality of second transistors comprise a plurality of second PMOS transistors and a plurality of second NMOS transistors, the plurality of first PMOS transistors share the first active region, the plurality of first NMOS transistors share the second active region, the plurality of second PMOS transistors share the third active region, and the plurality of second NMOS transistors share the fourth active region.

* * * * *